United States Patent
Bak et al.

(10) Patent No.: US 10,634,997 B2
(45) Date of Patent: Apr. 28, 2020

(54) COLORING COMPOSITION, COLOR FILTER, PATTERN FORMING METHOD, SOLID-STATE IMAGING DEVICE, AND IMAGE DISPLAY DEVICE

(71) Applicant: FUJIFILM Corporation, Tokyo (JP)

(72) Inventors: Seongmu Bak, Haibara-gun (JP); Naotsugu Muro, Haibara-gun (JP); Yoshinori Taguchi, Haibara-gun (JP); Akiko Yoshii, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 121 days.

(21) Appl. No.: 16/043,433

(22) Filed: Jul. 24, 2018

(65) Prior Publication Data

US 2018/0329295 A1 Nov. 15, 2018

Related U.S. Application Data

(63) Continuation of application No. PCT/JP2017/002058, filed on Jan. 23, 2017.

(30) Foreign Application Priority Data

Jan. 29, 2016 (JP) .................................. 2016-015781

(51) Int. Cl.
| | | |
|---|---|---|
| *G02B 5/20* | (2006.01) | |
| *G03F 7/027* | (2006.01) | |
| *G03F 7/00* | (2006.01) | |
| *C09D 17/00* | (2006.01) | |
| *C09B 47/04* | (2006.01) | |
| *G03F 7/038* | (2006.01) | |
| *G03F 7/105* | (2006.01) | |
| *G03F 7/029* | (2006.01) | |
| *G02B 5/22* | (2006.01) | |
| *C09B 29/33* | (2006.01) | |
| *G03F 7/033* | (2006.01) | |

(52) U.S. Cl.
CPC .......... *G03F 7/0007* (2013.01); *C09B 29/335* (2013.01); *C09B 47/04* (2013.01); *C09D 17/00* (2013.01); *C09D 17/003* (2013.01); *G02B 5/223* (2013.01); *G03F 7/027* (2013.01); *G03F 7/029* (2013.01); *G03F 7/0295* (2013.01); *G03F 7/033* (2013.01); *G03F 7/038* (2013.01); *G03F 7/105* (2013.01)

(58) Field of Classification Search
CPC ........ G03F 7/0007; G03F 7/027; G03F 7/038; G03F 7/105; G02B 5/223; G02F 1/133514; G02F 1/133516

USPC ............ 430/7, 270.1, 280.1, 281.1; 349/106
See application file for complete search history.

(56) References Cited

U.S. PATENT DOCUMENTS

| | | | |
|---|---|---|---|
| 6,028,123 A * | 2/2000 | Hirayama | ............ C09D 5/4411 522/151 |
| 2005/0074563 A1* | 4/2005 | Tatsuzawa | ............ C08F 222/40 428/1.1 |
| 2010/0248096 A1 | 9/2010 | Oota et al. | |
| 2011/0149215 A1* | 6/2011 | Shimizu | ................. G02B 5/201 349/106 |
| 2011/0228201 A1* | 9/2011 | Hsu | ..................... C09B 67/0033 349/106 |
| 2013/0307913 A1 | 11/2013 | Kawashima et al. | |
| 2014/0091267 A1 | 4/2014 | Hsu | |
| 2016/0327710 A1 | 11/2016 | Murakami | |

FOREIGN PATENT DOCUMENTS

| | | |
|---|---|---|
| JP | 10-333325 A | 12/1998 |
| JP | 2003-167113 A | 6/2003 |
| JP | 2003-192948 A | 7/2003 |
| JP | 2003-213171 A | 7/2003 |
| JP | 2004-091555 A | 3/2004 |
| JP | 2004-287367 A | 10/2004 |
| JP | 2009-102499 A | 5/2009 |
| JP | 2010-180289 A | 8/2010 |
| JP | 2011-057843 A | 3/2011 |
| JP | 2011-170307 A | 9/2011 |
| JP | 2011-253174 A | 12/2011 |
| JP | 2012-067151 A | 4/2012 |
| JP | 2012-113104 A | 6/2012 |
| JP | 2012-145604 A | 8/2012 |
| JP | 2015-034838 A | 2/2015 |

(Continued)

OTHER PUBLICATIONS

International Preliminary Report on Patentability dated Jul. 31, 2018 from the International Bureau in counterpart International application No. PCT/JP2017/002058.

(Continued)

*Primary Examiner* — John A McPherson
(74) *Attorney, Agent, or Firm* — Sughrue Mion, PLLC

(57) ABSTRACT

Provided is a coloring composition capable of producing a cured film having suppressed color unevenness even in a case where the coloring composition is used after being stored for a long period of time. In addition, provided are a color filter, a pattern forming method, a solid-state imaging device, and an image display device. The coloring composition includes a halogenated zinc phthalocyanine pigment, a maleimide compound, a curable compound other than the maleimide compound, and a solvent, in which the molecular weight of the maleimide compound is 100 to 400, and the content of the maleimide compound is 0.08 to 0.8 parts by mass with respect to 100 parts by mass of the halogenated zinc phthalocyanine pigment.

13 Claims, No Drawings

(56) References Cited

FOREIGN PATENT DOCUMENTS

| JP | 2015-151467 A | 8/2015 |
| JP | 2015-194521 A | 11/2015 |
| WO | 2012/102046 A1 | 8/2012 |

OTHER PUBLICATIONS

Written Opinion of the International Searching Authority, dated Mar. 21, 2017 from the International Bureau in counterpart International application No. PCT/JP2017/002058.

International Search Report dated Mar. 21, 2017 from the International Bureau in counterpart International application No. PCT/JP2017/002058.

* cited by examiner

COLORING COMPOSITION, COLOR FILTER, PATTERN FORMING METHOD, SOLID-STATE IMAGING DEVICE, AND IMAGE DISPLAY DEVICE

CROSS-REFERENCE TO RELATED APPLICATIONS

This application is a Continuation of PCT International Application No. PCT/JP2017/002058 filed on Jan. 23, 2017, which claims priority under 35 U.S.C § 119(a) to Japanese Patent Application No. 2016-015781 filed on Jan. 29, 2016. Each of the above application(s) is hereby expressly incorporated by reference, in its entirety, into the present application.

BACKGROUND OF THE INVENTION

1. Field of the Invention

The present invention relates to a coloring composition, a color filter, a pattern forming method, a solid-state imaging device, and an image display device.

2. Description of the Related Art

As a digital camera, a mobile phone with a camera, and the like have been further spreading in recent years, there has been an increasing demand for a solid-state imaging device such as a charge-coupled device (CCD) image sensor. A color filter has been used as a key device in a display or optical element.

A color filter has been produced using a coloring composition including a coloring agent and a curable compound (see JP2012-113104A, JP2003-167113A, JP2004-287367A, JP2011-57843A, and JP2003-192948A).

Furthermore, investigations have recently been conducted on use of a halogenated zinc phthalocyanine pigment which is a halogenated phthalocyanine pigment using zinc as a central metal in order to increase color reproducibility by securing a broader color gamut.

SUMMARY OF THE INVENTION

A coloring composition may be used immediately after it has been produced in some cases or is used after it has been stored for a long period of time in other cases. According to the investigation of the present inventors, it can be seen that in a case where a coloring composition including a halogenated zinc phthalocyanine pigment is stored for a long period of time, a pigment and the like may be aggregated during the storage, leading to occurrence of color unevenness in a cured film thus obtained.

Therefore, an object of the present invention is to provide a coloring composition including a halogenated zinc phthalocyanine pigment, which is capable of producing a cured film having suppressed color unevenness even in a case where the coloring composition is used after being stored for a long period of time, as well as a color filter, a pattern forming method, a solid-state imaging device, and an image display device.

The present inventors have conducted extensive studies, and as a result, they have found that the object can be accomplished by using a coloring composition which will be described later, leading to the completion of the present invention. That is, the present invention is as follows.

<1> A coloring composition comprising:
a halogenated zinc phthalocyanine pigment;
a maleimide compound represented by Formula (1);
a curable compound other than the maleimide compound; and
a solvent,
in which the molecular weight of the maleimide compound is 100 to 400, and the content of the maleimide compound is 0.08 to 0.8 parts by mass with respect to 100 parts by mass of the halogenated zinc phthalocyanine pigment,

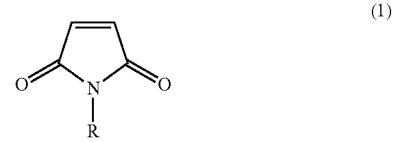

in Formula (1), R represents an alkyl group or an aryl group.

<2> The coloring composition as described in <1>, in which the maleimide compound is contained in the amount of 0.05% to 0.5% by mass with respect to the total solid content of the coloring composition.

<3> The coloring composition as described in <1> or <2>, in which the maleimide compound is contained in the amount of 0.2 to 2.0 parts by mass with respect to 100 parts by mass of the curable compound.

<4> The coloring composition as described in any one of <1> to <3>, in which the curable compound includes a compound having an epoxy group.

<5> The coloring composition as described in <4>, further comprising an aromatic amine compound.

<6> The coloring composition as described in any one of <1> to <5>, in which the curable compound includes a compound having an ethylenically unsaturated bond.

<7> The coloring composition as described in any one of <1> to <5>, in which the curable compound includes a compound having an epoxy group and a compound having an ethylenically unsaturated bond.

<8> The coloring composition as described in any one of <1> to <7>, further comprising a coloring agent having an azo group.

<9> The coloring composition as described in any one of <1> to <8>, used for a color filter.

<10> A color filter using the coloring composition as described in any one of <1> to <9>.

<11> A pattern forming method comprising:
a step of forming a coloring composition layer on a support, using the coloring composition as described in any one of <1> to <9>; and
a step of forming a pattern on the coloring composition layer by a photolithographic method or a dry etching method.

<12> A solid-state imaging device comprising the color filter as described in <10>.

<13> An image display device comprising the color filter as described in <10>.

According to the present invention, it is possible to provide a coloring composition capable of producing a cured film having suppressed color unevenness even in a case where the coloring composition is used after being stored for a long period of time, as well as a color filter, a pattern forming method, a solid-state imaging device, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "light" means actinic rays or radiation. Further, "actinic rays" or "radiation" means, for example, a bright line spectrum of a mercury lamp, far ultraviolet rays typified by an excimer laser, extreme ultraviolet rays (EUV light), X-rays, electron beams, or the like.

In the present specification, "exposure" includes, unless otherwise specified, not only exposure using a mercury lamp, far ultraviolet rays typified by an excimer laser, X-rays, EUV light, or the like, but also writing using particle rays such as electron beams and ion beams.

In the present specification, a numerical range expressed using "to" means a range that includes the preceding and succeeding numerical values of "to" as the lower limit value and the upper limit value, respectively.

In the present specification, the total solid content refers to a total mass of the components remaining in a case where a solvent is excluded from all the components of a coloring composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" not only represents an independent step, but also includes a step which is not clearly distinguished from other steps in a case where an intended action of the step is obtained.

In the present specification, a weight-average molecular weight (Mw) and a number-average molecular weight (Mn) are defined as values in terms of polystyrene through measurement by means of gel permeation chromatography (GPC).

In the present invention, a pigment means an insoluble compound which is sparingly soluble in a specific solvent. It typically means a compound which exists in a state where it is dispersed as particles in a composition. The pigment used in the present invention preferably has a solubility at 25° C. of, for example, 0.1 g/100 g Solvent or less in either of propylene glycol monomethyl ether acetate and water.

<Coloring Composition>

The coloring composition of the present invention includes a halogenated zinc phthalocyanine pigment, a maleimide compound represented by Formula (1) which will be described later, a curable compound other than the maleimide compound, and a solvent, in which the molecular weight of the maleimide compound is 100 to 400, and the content of the maleimide compound is 0.08 to 0.8 parts by mass with respect to 100 parts by mass of the halogenated zinc phthalocyanine pigment.

The coloring composition of the present invention is capable of producing a cured film having suppressed color unevenness even in a case where the coloring composition is used after being stored for a long period of time. A reason for obtaining such an effect is presumed to be as follows. That is, it is presumed that since aggregation of a pigment and the like during storage can be suppressed by interaction between the halogenated zinc phthalocyanine pigment and the maleimide compound, a cured film having suppressed color unevenness even in a case where the coloring composition is used after being stored for a long period of time can be produced. In addition, it is presumed that the maleimide compound has a small molecular weight and good compatibility with other components (for example, the curable compound and the solvent) included in the coloring composition, and thus, generation of aggregates during the storage can be more effectively suppressed.

It is presumed that for such the reason, the coloring composition of the present invention is capable of forming a cured film having suppressed color unevenness even in a case where the coloring composition is used after being stored for a long period of time.

Furthermore, the maleimide compound is considered to easily interact with the halogenated zinc phthalocyanine pigment, and even with a use of a small amount of the maleimide compound, the effect can be obtained. As a result, the amount of the maleimide compound to be blended can be reduced, and thus, the amount of components such as the curable compound to be blended can be increased, whereby good curability can be obtained.

Hereinafter, the respective components of the coloring composition of the present invention will be described.

<<Maleimide Compound>>

The coloring composition of the present invention includes a maleimide compound represented by Formula (1).

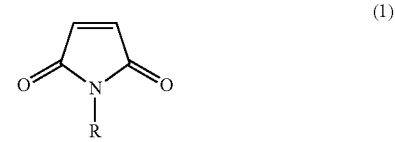

In Formula (1), R represents an alkyl group or an aryl group.

The number of carbon atoms of the alkyl group represented by R is preferably 1 to 20, more preferably 1 to 15, still more preferably 1 to 8, even still more preferably 1 to 5, and most preferably 1 to 3. The alkyl group may be linear, branched, or cyclic, and is preferably linear or branched, and more preferably linear.

The number of carbon atoms of the aryl group represented by R is preferably 6 to 20, and more preferably 6 to 12.

The alkyl group and the aryl group represented by R may have a substituent or may be unsubstituted. Examples of the substituent include a halogen atom, an alkyl group, an aryl group, a hydroxyl group, a carboxyl group, an alkoxy group, and an aryloxy group.

R is preferably an alkyl group. The alkyl group is preferably a linear or branched, unsubstituted alkyl group, and more preferably a linear unsubstituted alkyl group.

The molecular weight of the maleimide compound represented by Formula (1) is 100 to 400, preferably 100 to 350, and more preferably 100 to 300. Further, the molecular weight of the maleimide compound is a value calculated from a chemical formula thereof.

Specific examples of the maleimide compound represented by Formula (1) include methylmaleimide, N-phenylmaleimide, N-benzylmaleimide, N-tert-butylmaleimide, N,N'-orthophenylenebismaleimide, N,N'-metaphenylenebismaleimide, and N,N'-paraphenylenebismaleimide.

In the coloring composition of the present invention, the content of the maleimide compound is 0.08 to 0.8 parts by mass with respect to 100 parts by mass of the halogenated zinc phthalocyanine pigment. The lower limit value is preferably 0.1 parts by mass or more, and more preferably 0.15 parts by mass or more. The upper limit value is preferably 0.6 parts by mass or less, and more preferably 0.5 parts by mass or less. In a case where the content of the maleimide compound falls within the range, it is possible to produce a cured film having excellent curability as well as suppressed color unevenness even in a case where the coloring composition is used after being stored for a long period of time.

In the coloring composition of the present invention, the content of the maleimide compound is preferably 0.05% to 0.5% by mass with respect to the total solid content of the coloring composition. The lower limit value is more preferably 0.08% by mass or more, and still more preferably 0.1% by mass or more. The upper limit value is more preferably 0.4% by mass or less, still more preferably 0.3% by mass or less, and even still more preferably 0.2% by mass or less. In a case where the content of the maleimide compound falls within the range, it is possible to produce a cured film having excellent curability as well as suppressed color unevenness even in a case where the coloring composition is used after being stored for a long period of time.

In the coloring composition of the present invention, the content of the maleimide compound is preferably 0.2 to 2.0 parts by mass with respect to 100 parts by mass of the curable compound. The lower limit value is more preferably 0.3 parts by mass or more, and still more preferably 0.4 parts by mass or more. The upper limit value is more preferably 1.5 parts by mass or less, and still more preferably 1.0 part by mass or less. In a case where the content of the maleimide compound falls within the range, it is possible to produce a cured film having excellent curability as well as suppressed color unevenness even in a case where the coloring composition is used after being stored for a long period of time.

<<Halogenated Zinc Phthalocyanine Pigment>>

The coloring composition of the present invention includes a halogenated zinc phthalocyanine pigment. The halogenated zinc phthalocyanine pigment is a compound in which zinc as the central metal is positioned within a region surrounded by four nitrogen atoms of an isoindole ring. The halogenated zinc phthalocyanine pigment is preferably a compound represented by Formula (A1).

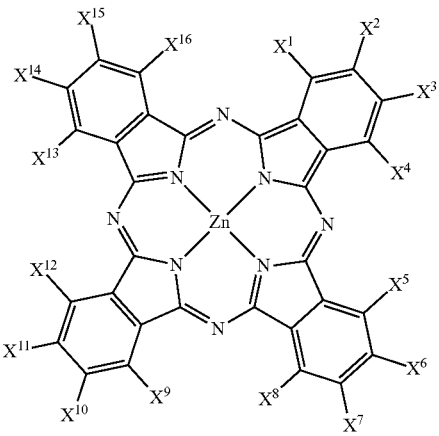

It is preferable that in Formula (A1), any 8 to 16 members of $X^1$ to $X^{16}$ each independently represent a halogen atom, and the others each represent a hydrogen atom or a substituent.

Examples of the halogen atom include a chlorine atom, a bromine atom, a fluorine atom, and an iodine atom, with the bromine atom or the chlorine atom being particularly preferable. With regard to the substituent, reference can be made to the descriptions of paragraph Nos. 0025 to 0027 of JP2013-209623A, the contents of which are incorporated herein by reference.

As for specific examples of the halogenated zinc phthalocyanine pigment, for example, the aspects shown in <1> and <2> below may be mentioned as preferred examples.

<1> A halogenated zinc phthalocyanine pigment in which the average number of halogen atoms per molecule of the phthalocyanine is 8 to 12. In this aspect, it is preferable that $X^1$ to $X^{16}$ include one or more chlorine atoms, bromine atoms, or hydrogen atoms. In addition, it is preferable that $X^1$ to $X^{16}$ have 0 to 4 chlorine atoms, 8 to 12 bromine atoms, and 0 to 4 hydrogen atoms. With regard to the specific examples, reference can be made to the description in paragraph Nos. 0013 to 0039, and 0084 to 0085 of JP2007-284592A, the contents of which are incorporated herein by reference.

<2> A halogenated zinc phthalocyanine pigment in which the average number of halogen atoms per molecule of the phthalocyanine is 10 to 14, and the average number of bromine atoms per molecule of the phthalocyanine is 8 to 12, and the average number of chlorine atoms per molecule of the phthalocyanine is 2 to 5. Specific examples thereof include the compounds described in WO2015/118720A.

Examples of the halogenated zinc phthalocyanine pigment include C. I. Pigment Green 58 and 59 as a compound classified into a pigment in Color Index (C. I.; published by The Society of Dyers and Colourists).

The content of the halogenated zinc phthalocyanine pigment is preferably 10% by mass or more, more preferably 20% by mass or more, and still more preferably 30% by mass or more, with respect to the total solid content in the coloring composition. The upper limit is preferably 80% by mass or less, more preferably 75% by mass or less, and still more preferably 70% by mass or less. The halogenated zinc phthalocyanine pigment may be of one kind or may include two or more kinds of compounds having different combinations of $X^1$ to $X^{16}$ of Formula (A1). In a case where two or more kinds of the compounds are included, a total amount thereof preferably falls within the range.

<<Other Coloring Agent>>

The coloring composition of the present invention may further include a coloring agent (another coloring agent) other than the halogenated zinc phthalocyanine pigment. Such another coloring agent may be either of a dye and a pigment, both of which may be used in combination. Examples of the pigment include various inorganic pigments or organic pigments known in the related art. Further, taking into consideration that whether it is an inorganic pigment or an organic pigment, a pigment having a high transmittance is preferable, a pigment having an average particle diameter which is as small as possible is preferably used, and taking handleability into consideration, the average particle diameter of the pigments is preferably 0.01 to 0.1 µm, and more preferably 0.01 to 0.05 µm.

Examples of the inorganic pigments include metal compounds such as a metal oxide and a metal complex salt, and specific examples thereof include black pigments such as carbon black and titanium black, oxides of metals such as iron, cobalt, aluminum, cadmium, lead, copper, titanium, magnesium, chromium, zinc, and antimony, and complex oxides of the metals.

Examples of the organic pigments include the following ones. These organic pigments may be used singly or in various combinations.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like C. I. Pigment Orange 2, 5, 13, 16, 17:1, 31, 34, 36, 38, 43, 46, 48, 49, 51, 52, 55, 59, 60, 61, 62, 64, 71, 73, and the like C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279

C. I. Pigment Green 7, 10, 36, and 37

C. I. Pigment Violet 1, 19, 23, 27, 32, 37, and 42

C. I. Pigment Blue 1, 2, 15, 15:1, 15:2, 15:3, 15:4, 15:6, 16, 22, 60, 64, 66, 79, and 80

As the dye, for example, the colorants disclosed in JP1989-90403A (JP-S64-90403A), JP1989-91102A (JP-S64-91102A), JP1989-94301A (JPH01-94301A), JP1994-11614A (JP-H06-11614A), JP2592207B, U.S. Pat. No. 4,808,501A, U.S. Pat. No. 505,950A, U.S. Pat. No. 5,667,920A, JP1993-333207A (JP-H05-333207A), JP1994-35183A (JP-H06-35183A), JP1994-51115A (JP-H06-51115A), and JP1994-194828A (JP-H06-194828A) can be used. With respect to the chemical structure, a pyrazoleazo compound, a pyrromethene compound, an anilinoazo compound, a triphenylmethane compound, an anthraquinone compound, a benzylidene compound, an oxonol compound, a pyrazoletriazole azo compound, a pyridoneazo compound, a cyanine compound, a phenothiazine compound, a pyrrolopyrazoleazomethine compound, or the like can be used.

Furthermore, as the dye, a colorant multimer can be used. The colorant multimer is preferably used after being dissolved in a solvent, but the colorant multimer may form a particle. In a case where the colorant multimer is the particle, the colorant multimer is usually used in a state of being dispersed in a solvent. The colorant multimer in the particle state can be obtained by, for example, emulsion polymerization, and specific examples thereof include the compounds and production methods described in JP2015-214682A. In addition, as the colorant multimer, the compounds described in JP2011-213925A, JP2013-041097A, JP2015-028144A, JP2015-030742A, and the like can also be used.

Furthermore, as such the other coloring agent, the compounds described in paragraph Nos. 0011 to 0034 of JP2013-54339A, the compounds described in paragraph Nos. 0013 to 0058 of JP2014-26228A, and the like which are yellow coloring agents can also be used.

Moreover, as such the other coloring agent, an aluminum phthalocyanine compound having a phosphorus atom which is a blue pigment can also be used. Specific examples thereof include the compounds described in paragraph Nos. 0022 to 0030 of JP2012-247591A, and the compounds described in paragraph No. 0047 of JP2011-157478A.

In the present invention, such the other coloring agent is preferably a yellow coloring agent. Examples of the yellow coloring agent include an azo compound, a quinophthalone compound, a pyrazolone compound, a benzimidazolone compound, a quinoxaline compound, an azomethine compound, an isoindolinone compound, an isoindoline compound, and an anthraquinone compound. According to this aspect, good spectroscopy is easily obtained. In particular, a color filter having spectroscopy suitable as a color filter for forming a green pixel is easily produced.

In the present invention, such the other coloring agent is also preferably a coloring agent having an azo group (azo compound). According to this aspect, good spectroscopy is easily obtained.

In a case where the coloring composition of the present invention contains another coloring agent, the content of such the other coloring agent is preferably 10 to 100 parts by mass with respect to 100 parts by mass of the halogenated zinc phthalocyanine pigment. The upper limit is more preferably 90 parts by mass or less, and still more preferably 80 parts by mass or less. The lower limit is more preferably 15 parts by mass or more, and still more preferably 20 parts by mass or more. Within the range, spectroscopy characteristics that are preferred in terms of color reproducibility are obtained.

<<Curable Compound>>

The coloring composition of the present invention contains a curable compound other than the above-mentioned maleimide compound. As the curable compound, known compounds which can be crosslinked by a radical, an acid, or heat can be used. Examples thereof include compounds having an ethylenically unsaturated bond (hereinafter also referred to as a polymerizable compound), a compound having an epoxy group (hereinafter also referred to as an epoxy compound), and a compound having a methylol group. Examples of the polymerizable compound include a compound having a group having an ethylenically unsaturated bond such as a vinyl group, a (meth)allyl group, and a (meth)acryloyl group. The polymerizable compound is preferably a radically polymerizable compound.

In the present invention, the curable compound is preferably an epoxy compound and/or a polymerizable compound, and it is more preferable to use a combination of the epoxy compound and the polymerizable compound.

The content of the curable compound is preferably 0.1% to 50% by mass with respect to the total solid content of the coloring composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where a combination of two or more kinds of the curable compounds is used, a total amount thereof preferably falls within the range.

Furthermore, in a case of using a combination of the polymerizable compound and the epoxy compound, the content of the polymerizable compound is preferably 100 to 600 parts by mass 100 parts by mass of the epoxy compound. The lower limit is more preferably 150 parts by mass or more. The upper limit is more preferably 550 parts by mass or less.

(Polymerizable Compound (Compound Having Ethylenically Unsaturated Bond))

In the present invention, the polymerizable compound may be, for example, any of chemical forms such as a monomer, a prepolymer, that is, a dimer, a trimer, and an oligomer, or a mixture thereof, a multimer thereof, and the like. The molecular weight of the monomer-type polymerizable compound (polymerizable monomer) is preferably 100 to 3,000. The upper limit is more preferably 2,000 or less, and still more preferably 1,500 or less. The lower limit is more preferably 150 or more, and still more preferably 250 or more.

The polymerizable compound is preferably a trifunctional to pentadecafunctional (meth)acrylate compound, and more preferably a trifunctional to hexafunctional (meth)acrylate compound. With regard to the specific compound thereof, reference can be made to the compounds described in paragraph Nos. 0095 to 0108 of JP2009-288705A, paragraph No. 0227 of JP2013-29760A, and paragraph Nos. 0254 to 0257 of JP2008-292970A, the contents of which are incorporated herein by reference.

As the polymerizable compound, dipentaerythritol triacrylate (KAYARAD D-330; manufactured by Nippon Kayaku Co., Ltd., as a commercially available product), dipentaerythritol tetraacrylate (KAYARAD D-320; manufactured by Nippon Kayaku Co., Ltd., as a commercially available product), dipentaerythritol penta(meth)acrylate (KAYARAD D-310; manufactured by Nippon Kayaku Co., Ltd., as a commercially available product), dipentaerythritol hexa(meth)acrylate (KAYARAD DPHA; manufactured by Nippon Kayaku Co., Ltd., and A-DPH-12E; manufactured by Shin-Nakamura Chemical Co., Ltd., as a commercially available product), and structures thereof in which a (meth)acryloyl group is bonded via an ethylene glycol or propylene glycol residue (for example, SR454 and SR499, commercially available from Sartomer Company, Inc.) are preferable. Oligomer types of these can also be used. Further, KAYARAD RP-1040 and DPCA-20 (manufactured by Nippon Kayaku Co., Ltd.) can also be used. In addition, ARONIX M-305, M-306, M-309, M-450, M-402, TO-1382, and TO-2349 (all trade names; all manufactured by Toagosei Co., Ltd.) can also be used.

The polymerizable compound may have an acid group such as a carboxyl group, a sulfonic acid group, and a phosphoric acid group. Examples of the commercially available product thereof include M-305, M-306, M-309, M-450, M-402, TO-1382, and TO-2349 which are each polybasic acid-modified acryl oligomers manufactured by Toagosei Co., Ltd.

The acid value of the polymerizable compound having an acid group is preferably 0.1 to 40 mgKOH/g, and more preferably 5 to 30 mgKOH/g. In a case where the acid value of the polymerizable compound is 0.1 mgKOH/g or more, the development and dissolution characteristics are good, whereas in a case where the acid value is 40 mgKOH/g or less, it is advantageous in terms of production or handling. In addition, the photopolymerization performance is good and the curability is excellent.

In another preferred aspect, the polymerizable compound is a compound having a caprolactone structure.

The polymerizable compound having a caprolactone structure is commercially available as KAYARAD DPCA series from Nippon Kayaku Co., Ltd., and examples thereof include DPCA-20, DPCA-30, DPCA-60, and DPCA-120.

As to the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth)acrylate compound having 4 to 20 ethyleneoxy groups.

Examples of the commercially available product of the polymerizable compound having an alkyleneoxy group include SR-494 which is a tetrafunctional acrylate having four ethyleneoxy groups, manufactured by Sartomer Co., Inc., DPCA-60 which is a hexafunctional acrylate having six pentyleneoxy groups, and TPA-330 which is a trifunctional acrylate having three isobutyleneoxy groups, both manufactured by Nippon Kayaku Co., Ltd.

As the polymerizable compound, the urethane acrylates described in JP1973-41708B (JP-S48-41708B), JP1976-37193A (JP-S51-37193A), JP1990-32293B (JP-H02-32293B), and JP1990-16765B (JP-H02-16765B), and the urethane compounds which have an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, it is also preferable to use the addition-polymerizable compounds having an amino structure or a sulfide structure in the molecule, described in JP1988-277653A (JP-S63-277653A), JP1988-260909A (JP-S63-260909A), and JP1989-105238A (JP-H01-105238A).

Examples of commercially available products thereof include urethane oligomers UAS-10 and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, and AI-600 (manufactured by Kyoeisha Chemical Co., Ltd.).

In the present invention, a polymer having a group having an ethylenically unsaturated bond in a side chain (hereinafter also referred to as a polymerizable polymer) can also be used as the polymerizable compound.

As the polymerizable polymer, a compound including a repeating unit having a radically polymerizable group in the side chain is preferable, and a compound having a repeating unit represented by Formula (1) is more preferable.

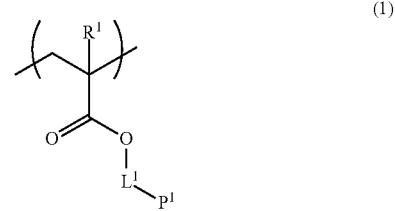

(1)

In the formula, $R^1$ represents a hydrogen atom or an alkyl group, $L^1$ represents a single bond or a divalent linking group, and $P^1$ represents a group having an ethylenically unsaturated bond.

The alkyl group represented by $R^1$ is preferably an alkyl group having 1 to 3 carbon atoms, and more preferably a methyl group. $R^1$ is preferably a hydrogen atom or a methyl group.

$L^1$ represents a single bond or a divalent linking group. Examples of the divalent linking group include an alkylene group having 1 to 30 carbon atoms, an arylene group having 6 to 12 carbon atoms, —CO—, —OCO—, —O—, —NH—, —SO$_2$—, and a group formed by combination thereof. The alkylene group and the arylene group may have a substituent or may be unsubstituted. Examples of the substituent include a halogen atom, an alkyl group, an aryl group, a hydroxyl group, a carboxyl group, an alkoxy group, and an aryloxy group, with the hydroxyl group being preferable.

$P^1$ represents a group having an ethylenically unsaturated bond. Examples of the group having an ethylenically unsaturated bond include a vinyl group, a (meth)allyl group, and a (meth)acryloyl group.

The content of the repeating unit having a radically polymerizable group in a side chain is preferably 5% to 100% by mass of the repeating units. The lower limit is more preferably 10% by mass or more, and still more preferably 15% by mass or more. The upper limit is more preferably 95% by mass or less, and still more preferably 90% by mass or less.

The polymerizable polymer may include another repeating unit, in addition to the repeating unit represented by Formula (1). Such other repeating unit may include a functional group such as an acid group, or may not include the functional group.

Examples of the acid group include a carboxyl group, a sulfonic acid group, and a phosphoric acid group. One kind or two or more kinds of the acid groups may be included.

The proportion of the repeating unit having an acid group is preferably 0% to 50% by mass of all the repeating units constituting the polymerizable polymer. The lower limit is more preferably 1% by mass or more, and still more preferably 3% by mass or more. The upper limit is more preferably 35% by mass or less, and still more preferably 30% by mass or less.

Examples of other functional groups include a development promoting group such as a lactone, an acid anhydride, an amide, and a cyano group, a long-chain and cyclic alkyl group, an aralkyl group, an aryl group, a polyalkylene oxide group, a hydroxyl group, a maleimide group, and an amino group, which can be appropriately introduced.

Furthermore, a repeating unit derived from an ether dimer described for a resin which will be described later, a repeating unit derived from a compound represented by Formula (X) described for a resin which will be described later, and the like can be included.

Examples of a commercially available product of the polymerizable polymer include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Chemical Industries, Ltd.), EBECRYL 3800 (manufactured by Daicel-UCB Co., Ltd.), ACRYCURE RD-F8 (manufactured by Nippon Shokubai Co., Ltd.), and DP-1305 (manufactured by Fuji Fine Chemicals Co.).

In a case where a polymerizable compound is used as the curable compound, the content of the polymerizable compound is preferably 0.1% to 50% by mass with respect to the total solid content of the coloring composition. The lower limit is, for example, more preferably 0.5% by mass or more, and still more preferably 1% by mass or more. The upper limit is, for example, more preferably 45% by mass or less, and still more preferably 40% by mass or less.

As the polymerizable compound, only a polymerizable monomer may be used, only a polymerizable polymer may be used, and a combination of the polymerizable monomer and the polymerizable polymer may be used. It is more preferable to use a combination of the polymerizable monomer and the polymerizable polymer. In a case of using the both in combination, the amount of the polymerizable polymer is preferably 10 to 40 parts by mass with respect to 100 parts by mass of the polymerizable monomer. The lower limit is, for example, preferably 15 parts by mass or more. The upper limit is preferably, for example, 35 parts by mass or less.

Furthermore, the content of the polymerizable compound is preferably 10% to 100% by mass, and more preferably 30% to 100% by mass, with respect to the total mass of the curable compound.

The polymerizable compounds may be used singly or in combination of two or more kinds thereof. In a case where two or more kinds of the polymerizable compounds are used in combination, a total amount thereof preferably falls within the range.

(Epoxy Compound (Compound Having Epoxy Group))

In the present invention, an epoxy compound can also be used as the curable compound. Examples of the epoxy compound include a compound having one or more epoxy groups per molecule, with a compound having two or more epoxy groups per molecule being preferable. The number of epoxy groups per molecule is preferably 1 to 100. The lower limit is preferably 2 or more. The upper limit can be set to, for example, 10 or less, or to 5 or less.

The epoxy compound in the present invention is preferably a structure having an aromatic ring and/or an aliphatic ring, and more preferably a structure having an aliphatic ring. The epoxy group is preferably bonded to an aromatic ring and/or an aliphatic ring via a single bond or a linking group. Examples of the linking group include an alkylene group, an arylene group, —O—, —NR'— (R' represents a hydrogen atom, an alkyl group which may have a substituent, or an aryl group which may have a substituent, with the hydrogen atom being preferable), —SO$_2$—, —CO—, —O—, —S—, and a group formed by combination thereof. In a case of a compound having an aliphatic ring, a compound in which an epoxy group is bonded to an aliphatic ring via a direct bond (a bond through a single bond) is preferable. In a case of a compound having an aromatic ring, a compound in which an epoxy group is bonded to an aromatic ring via a linking group is preferable. The linking group is preferably an alkylene group, or a group formed by combination of an alkylene group with —O—. In addition, as the epoxy compound, a compound having a structure in which 2 or more aromatic rings are linked to a hydrocarbon group can also be used. The hydrocarbon group is preferably an alkylene group having 1 to 6 carbon atoms. The epoxy group is preferably linked via the linking group.

The epoxy equivalent (=the molecular weight of the compound having an epoxy group/the number of epoxy groups) of the epoxy compound is preferably 500 g/eq or less, more preferably 100 to 400 g/eq, and still more preferably 100 to 300 g/eq.

The epoxy compound may be either a low-molecular-weight compound (for example, a molecular weight of less than 2,000, and further a molecular weight of less than 1,000) or a high-molecular-weight compound (macromolecule) (for example, a molecular weight of 1,000 or more, and in a case of a polymer, a weight-average molecular weight of 1,000 or more). The weight-average molecular weight of the epoxy compound is preferably 200 to 100,000, and more preferably 500 to 50,000. The upper limit of the weight-average molecular weight is more preferably 10,000 or less, still more preferably 5,000 or less, and even still more preferably 3,000 or less.

As the epoxy compound, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. Examples of the commercially available products thereof include jER825, jER827, jER828, jER834, jER1001, jER1002, jER1003, jER1055, jER1007, jER1009, and jER1010 (all manufactured by Mitsubishi Chemical Corporation), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Mitsubishi Chemical Corporation), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Mitsubishi Chemical Corporation), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (all manufactured by Nippon Kayaku Co., Ltd.) as a cresol novolac type epoxy resin; and ADEKA RESIN EP-4080S, ADEKA RESIN EP-40855, and ADEKA RESIN EP-40885 (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-40005, EP-40035, EP-40105, EP-40115, NC-2000, NC-3000, NC-7300, XD-1000, EPPN-501, and EPPN-502 (all manufactured by ADEKA Corporation), and jER1031S (manufactured by Mitsubishi Chemical Corporation).

Moreover, a compound represented by Formula (EP1) can also be used as the epoxy compound.

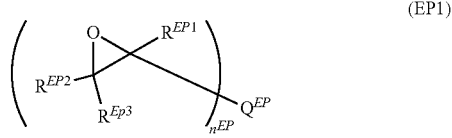

(EP1)

In Formula (EP1), $R^{EP1}$ or $R^{EP3}$ each represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a ring structure. $Q^{EP}$ represents a single bond or an $n^{EP}$-valent organic group. $R^{EP1}$ to $R^{EP3}$ may also be bonded to $Q^{EP}$ to form a ring structure. $n^{EP}$ represents an integer of 1 or more, preferably 2 to 10, and more preferably 2 to 6. Incidentally, in a case where $Q^{EP}$ is a single bond, $n^{EP}$ is 2.

With reference to the details of $R^{EP1}$ to $R^{EP3}$, or $Q^{EP}$, reference can be made to the description in paragraph Nos. 0087 to 0088 of JP2014-089408A, the contents of which are incorporated herein by reference. Specific examples of the compound represented by Formula (EP1) include glycidyl trityl ether. Other examples thereof include the compounds described in paragraph No. 0090 of JP2014-089408A, the contents of which are incorporated herein by reference.

In a case where an epoxy compound is used as the curable compound, the content of the epoxy compound is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The epoxy compounds may be used singly or in combination of two or more kinds thereof. In a case where two or more kinds of the epoxy compounds are used in combination, a total amount thereof preferably falls within the range.

In addition, the content of the epoxy compound is preferably 1% to 80% by mass, and more preferably 1% to 50% by mass, with respect to the total mass of the curable compound.

<<Resin>>

The coloring composition of the present invention preferably includes a resin. The resin is blended in applications, such as an application for dispersing a pigment in the composition or an application as a binder. Incidentally, a resin which is usually used for dispersing a colorant such as a pigment is also referred to as a dispersant. However, such uses of the resin are only exemplary, and the resin can also be used for other purposes, in addition to the above-mentioned uses. In addition, in the present invention, the resin may also have a curable group. In a case where the resin has a curable group, the resin also corresponds to a curable compound. Examples of the curable compound include a compound having an ethylenically unsaturated bond and a compound having an epoxy group.

In the coloring composition in the present invention, the content of the resin is preferably 1% to 80% by mass with respect to the total solid content of the coloring composition. The lower limit is more preferably 5% by mass or more, and still more preferably 10% by mass or more. The upper limit is more preferably 70% by mass or less, and still more preferably 60% by mass or less.

<<<Dispersant>>>

The coloring composition of the present invention preferably includes a dispersant as the resin. Examples of the dispersant include an acidic dispersant (acidic resin) and a basic dispersant (basic resin).

It is preferable that the dispersant includes at least an acidic dispersant, and it is more preferable that the dispersant includes an acidic dispersant alone. By making the dispersant include at least the acidic dispersant, the dispersibility of the coloring agent is improved and the brightness unevenness is hardly generated. Further, since excellent developability is obtained, pattern formation can be suitably formed by photolithography. In addition, an expression, "the dispersant includes an acidic dispersant alone" means, for example, that the content of the acidic dispersant in the total mass of the dispersant is preferably 99% by mass or more, and can be 99.9% by mass or more.

Here, the acidic dispersant (acidic resin) is a resin in which the amount of acid groups is more than that of basic groups. As the acidic dispersant (acidic resin), a resin in which the amount of the acid groups is 70% by mole or more with respect to 100% by mole of the total amount of the acid groups and the basic groups is preferable, and a resin which is only substantially composed of acid groups is more preferable. The acid group contained in the acidic dispersant (acidic resin) is preferably a carboxyl group.

Furthermore, the basic dispersant (basic resin) is a resin in which the amount of acid groups is more than that of basic groups. As the basic dispersant (basic resin), a resin in which the amount of the basic groups is 50% by mole or more with respect to 100% by mole of the total amount of the acid groups and the basic groups is preferable. The basic group contained in the basic dispersant is preferably an amine.

The acid value of the acidic dispersant (acidic resin) is preferably 5 to 105 mgKOH/g.

Examples of the dispersant include polymer dispersants [for example, a polyamidoamine and a salt thereof, a polycarboxylic acid and a salt thereof, an unsaturated high-molecular-weight acid ester, a modified polyurethane, a modified polyester, a modified poly(meth)acrylate, a (meth) acrylic copolymer, and a naphthalenesulfonic acid/formalin condensate], a polyoxyethylene alkyl phosphate ester, a polyoxyethylene alkylamine, and an alkanolamine.

The polymer dispersant can further be classified into a linear polymer, a terminal-modified polymer, a graft-type polymer, and a block-type polymer, depending on its structure. The polymer dispersant is adsorbed on a surface of a pigment and acts so as to prevent re-aggregation. For this reason, examples of a preferable structure thereof include a terminal-modified polymer, a graft-type polymer, and a block-type polymer, which have an anchoring site on a surface of a pigment. In addition, the dispersants described in paragraph Nos. 0028 to 0124 of JP2011-070156A, or the dispersants described in JP2007-277514A are also preferably used, and the contents of the publications are incorporated herein by reference.

As the dispersant, a resin represented by Formula (D) is preferably used.

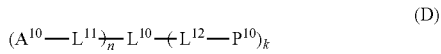

In Formula (D), $L^{10}$ represents an (n+k)-valent linking group, $L^{11}$ and $L^{12}$ each independently represent a single bond or a divalent linking group, $A^{10}$ represents a monovalent organic group containing at least one structure or group selected from a colorant structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group; n $A^{10}$'s and n $L^{11}$'s may be each independently the same as or different from each other. k $L^{12}$'s may be the same as or different from each other. k represents 1 to 8, n represents 2 to 9, and k+n satisfies 3 to 10. $P^{10}$ represents a monovalent polymer chain having a repeating unit.

With regard to the details of $L^{10}$ to $L^{12}$, and $P^{10}$, reference can be made to paragraph Nos. 0071 to 0098 of JP2007-277514A, the contents of which are incorporated herein by reference.

$A^{10}$ represents a monovalent organic group containing at least one structure or group selected from a colorant structure, a heterocyclic structure, an acidic group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxyl group. With regard to the monovalent organic group, reference can be made to paragraph Nos. 0041 to 0070 of JP2007-277514A, the contents of which are incorporated herein by reference.

Specific examples of the resin represented by Formula (D) include the following resins, as well as the resins described in paragraph Nos. 0327 to 0347 of JP2007-277514A, the contents of which are incorporated herein by reference.

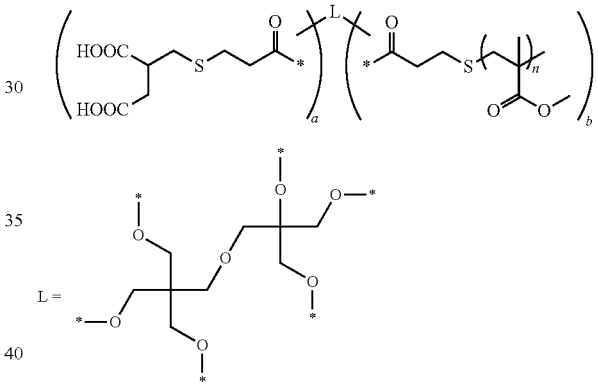

As the resin (dispersant), a graft copolymer including a repeating unit represented by any one of Formulae (1) to (4) can also be used.

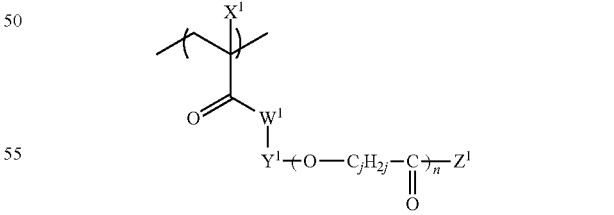

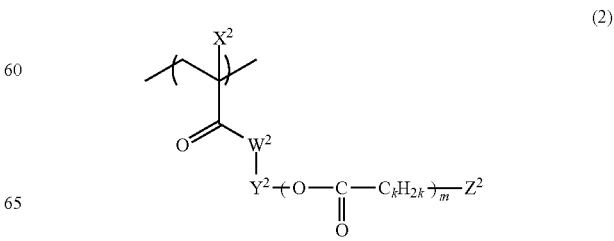

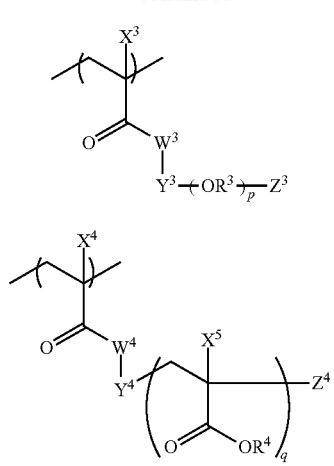

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom, a monovalent organic group, or a halogen atom, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$, and $W^4$ are each preferably an oxygen atoms. $X^1$, $X^2$, $X^3$, $X^4$, and $X^5$ are each preferably a hydrogen atom or an alkyl group having 1 to 12 carbon atoms, and are each independently more preferably a hydrogen atom or a methyl group, and particularly preferably methyl groups. $Y^1$, $Y^2$, $Y^3$, and $Y^4$ each independently represent a divalent linking group, and the linking group is not particularly limited in their structures. The structure of the monovalent organic group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is particularly preferable that $Z^1$, $Z^2$, $Z^3$, and $Z^4$ each independently represent an alkyl group or an alkoxy group having 5 to 24 carbon atoms, and among these, a branched alkyl group having 5 to 24 carbon atoms, a cyclic alkyl group having 5 to 24 carbon atoms, or an alkoxy group having 5 to 24 carbon atoms is preferable. In addition, the alkyl group contained in the alkoxy group may be linear, branched, or cyclic.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is particularly preferable. In Formula (4), in a case where q is 2 to 500, $X^5$'s and $R^4$'s which are present in plural numbers in a graft copolymer may be the same as or different from each other.

With regard to the graft copolymer, reference can be made to the description in paragraph Nos. 0025 to 0094 of JP2012-255128A, the contents of which are incorporated herein by reference. Specific examples of the graft copolymer include resins shown below. The resins are graft copolymers including the above-mentioned repeating unit represented by Formula (3). Other examples thereof include the resins described in paragraph Nos. 0072 to 0094 of JP2012-255128A, the contents of which are incorporated herein by reference.

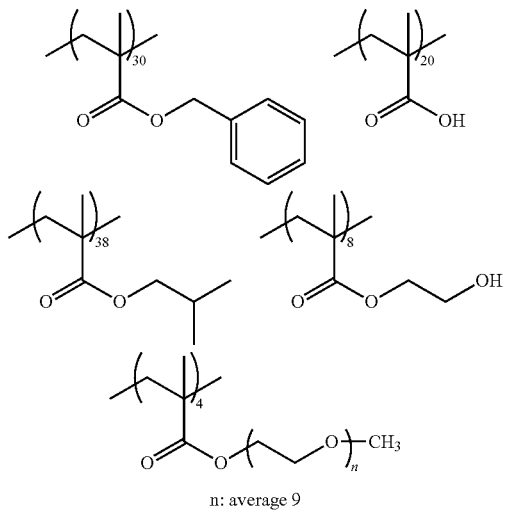

n: average 9

Furthermore, as the resin (dispersant), an oligoimine-based dispersant having a nitrogen atom in at least one of the main chain or a side chain can be used. As the oligoimine-based dispersant, a resin having a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

With regard to the oligoimine-based dispersant, reference can be made to the description in paragraph Nos. 0102 to 0174 of JP2012-255128A, the contents of which are incorporated herein by reference. Specific examples of the oligoimine-based dispersant include the resins described in paragraph Nos. 0168 to 0174 of JP2012-255128A.

The dispersant is also available as a commercially available product, and specific examples thereof include "DA-7301" manufactured by Kusumoto Chemicals, Ltd., "Disperbyk-101 (polyamidamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers)", and "BYK-P104 and P105 (unsaturated high-molecular-weight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalenesulfonic acid/formalin polycondensate), MS, C, and SN-B (aromatic sulfonic acid/formalin polycondensate), HOMOGENOL L-18 (polymeric polycarboxylic acid), EMULGEN 920, 930, 935, and 985 (polyoxyethylene nonyl phenyl ether), and ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft-type polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" manufactured by Kawaken Fine Chemicals Co., Ltd., "Organosiloxane Polymer KP-341" manufactured by Shin-Etsu Chemical Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA Corporation, and "IONET S-20" manufactured by Sanyo Chemical Industries, Ltd.

In addition, the resins described in the section for the dispersant can also be used in applications other than those as dispersants. For example, the resins can also be used as a binder.

<<<Alkali-Soluble Resin>>>

The coloring composition of the present invention can contain an alkali-soluble resin as the resin. By incorporation of the alkali-soluble resin, the developability or the pattern forming properties is improved. In addition, the alkali-soluble resin can also be used as a dispersant or a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high-molecular-weight polymer, and can be appropriately selected from alkali-soluble resins having at least one group enhancing alkali solubility in a molecule (preferably a molecule having an acrylic copolymer or a styrene-based copolymer as a main chain).

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali solubility (hereinafter also referred to as an acid group) include a carboxyl group, a phosphoric acid group, a sulfonic acid group, and a phenolic hydroxyl group. The group enhancing alkali solubility is preferably a group which is soluble in an organic solvent and can be developed by an aqueous weak alkaline solution, and particularly preferred examples thereof include a carboxyl group. These acid groups may be used singly or in combination of two or more kinds thereof.

As the alkali-soluble resin, polymers having a carboxyl group in a side chain are preferable. Examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, a vinyl compound, and an N-position-substituted maleimide monomer. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer, and examples of the N-position-substituted maleimide monomer include N-phenylmaleimide, N-cyclohexylmaleimide, and the like described in JP1998-300922A (JP-H10-300922A). Further, other monomers copolymerizable with the (meth)acrylic acid may be used singly or in combination of two or more kinds thereof.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can also be preferably used. Further, those obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/ polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. In addition, as a commercially available product thereof, for example, FF-426 (manufactured by Fujikura Kasei Co., Ltd.) or the like can also be used.

It is also preferable that the alkali-soluble resin includes a polymer obtained by polymerizing monomer components including a compound represented by Formula (ED1) and/or the compound represented by Formula (1) of JP2010-168539A (these compounds are hereinafter also referred to as an "ether dimer" in some cases).

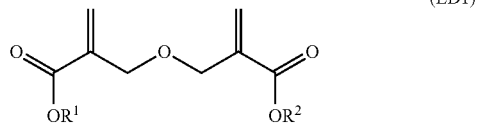
(ED1)

In Formula (ED1), $R^1$ and $R^2$ each independently represent a hydrogen atom or a hydrocarbon group having 1 to 25 carbon atoms, which may have a substituent.

With regard to specific examples of the ether dimer, reference can be made to paragraph No. 0317 of JP2013-29760A, the contents of which are incorporated herein by reference. These ether dimers may be of one kind or of two or more kinds.

The alkali-soluble resin may include a repeating unit derived from a compound represented by Formula (X).

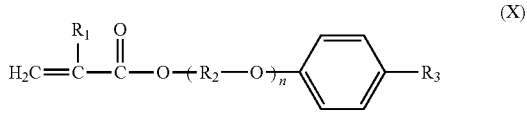
(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms in the alkylene group of $R_2$ is preferably 2 or 3. Further, the number of carbon atoms in the alkyl group of $R_3$ is 1 to 20, and more preferably 1 to 10, and the alkyl group of $R_3$ may include a benzene ring. Examples of the alkyl group including a benzene ring, represented by $R_3$, include a benzyl group and a 2-phenyl(iso)propyl group.

With regard to the alkali-soluble resin, reference can be made to the descriptions in paragraph Nos. 0558 to 0571 of JP2012-208494A ([0685] to [0700] of the corresponding US2012/0235099A), the contents of which are incorporated herein by reference. In addition, the copolymers (B) described in paragraph Nos. 0029 to 0063 of JP2012-32767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-137531A and the binder resins used in Examples of the document, the binder resins described in paragraph Nos. 0132 to 0143 of JP2013-024934A and the binder resins used in Examples of the document, the binder resins described in paragraph Nos. 0092 to 0098 of JP2011-242752A and the binder resins used in Examples of the document, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, even still more preferably 150 mgKOH/g or less, and particularly preferably 120 mgKOH/g or less.

The content of the alkali-soluble resin is preferably 1% to 80% by mass with respect to the total solid content of the coloring composition. The lower limit is more preferably 2% by mass or more, and still more preferably 3% by mass or more. The upper limit is more preferably 70% by mass or less, and still more preferably 60% by mass or less. The coloring composition of the present invention may include one kind or two or more kinds of the alkali-soluble resins. In a case where two or more kinds of the alkali-soluble resins are included, a total amount thereof preferably falls within the range.

<<Solvent>>

The coloring composition of the present invention contains a solvent. The solvent is preferably an organic solvent. The organic solvent is not particularly limited as long as it satisfies the solubility of the respective components or the coatability of the coloring composition.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monmethyl ether acetate (1-methoxy-2-propylacetate), propylene glycol monoethyl ether acetate, propylene glycol monopropyl ether acetate, and 2-methoxy-1-propylacetate; ketones, for example, methyl ethyl ketone, cyclohexanone, cyclopentanone, 2-heptanone, and 3-heptanone; and aromatic hydrocarbons, for example, toluene and xylene.

However, it is preferable in some cases to reduce aromatic hydrocarbons (benzene, toluene, xylene, ethylbenzene, and the like) (for example, the amount can be set to 50 ppm or less, 10 ppm or less, or 1 ppm or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, the organic solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate (1-methoxy-2-propylacetate), and 2-methoxy-1-propylacetate.

In the present invention, the organic solvent preferably includes 2-methoxy-1-propylacetate. The content of 2-methoxy-1-propylacetate is preferably 0.001% to 5% by mass with respect to the mass of the coloring composition. The upper limit is more preferably 3% by mass or less, and still more preferably 2% by mass or less.

Furthermore, the content of 2-methoxy-1-propylacetate is preferably 0.01% to 0.5% by mass with respect to the mass of the solvent. The lower limit is more preferably 0.05% by mass or more, and still more preferably 0.1% by mass or more. The upper limit is more preferably 0.4% by mass or less, and still more preferably 0.2% by mass or less.

In the present invention, the organic solvent preferably has a content of peroxides of 0.8 mmol/L or less, and more preferably, it does not substantially include peroxides. Further, it is preferable to use an organic solvent having a small metal content, and for example, the metal content of the organic solvent is preferably 10 ppb or less. As desired, the organic solvent having a metal content at a ppt level may be used, and such a high-purity solvent is provided by, for example, Toyo Kasei Kogyo Co., Ltd. (The Chemical Daily, Nov. 13, 2015).

The content of the solvent is preferably an amount such that the total solid content of the coloring composition is 5% to 80% by mass. The lower limit is more preferably 10% by mass or more. The upper limit is more preferably 60% by mass or less, still more preferably 50% by mass or less, and even still more preferably 40% by mass or less.

<<Curing Accelerator>>

A curing accelerator may be added to the coloring composition of the present invention for the purpose of accelerating the reaction of a curable compound or lowering a curing temperature. Examples of the curing accelerator include an aromatic amine compound and a thiol compound.

(Aromatic Amine Compound)

In a case where the curable compound includes an epoxy compound, it is preferable that the curable compound includes an aromatic amine compound. According to this aspect, good curability is easily obtained. The aromatic amine compound may be a monofunctional aromatic amine compound having one amino group, or polyfunctional aromatic amine compound having two or more amino groups. The aromatic amine compound is preferably a compound represented by Formula (Am-1) or Formula (Am-2), and more preferably a compound represented by Formula (Am-2).

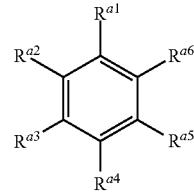

(Am-1)

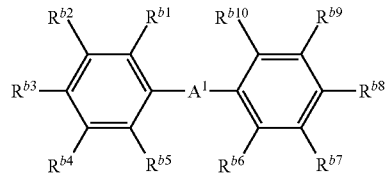

(Am-2)

In Formula (Am-1) $R^{a1}$ to $R^{a6}$ each independently represent a hydrogen atom or a substituent, and at least one of $R^{a1}$, ..., or $R^{a6}$ represents $-NR^{100}R^{101}$ or a group having $-NR^{100}R^{101}$. $R^{100}$ and $R^{101}$ each independently represent a hydrogen atom or a substituent. Two adjacent groups of $R^{a1}$ to $R^{a6}$ may be bonded to each other to form a ring.

In Formula (Am-2), $R^{b1}$ to $R^{b10}$ each independently represent a hydrogen atom or a substituent, at least one of $R^{b1}$, ..., or $R^{b10}$ represents $-NR^{100}R^{101}$ or a group having $-NR^{100}R^{101}$. Two adjacent groups of $R^{b1}$ to $R^{b10}$ may be bonded to each other to form a ring. $A^1$ represents a single bond or a divalent linking group. $R^{100}$ and $R^{101}$ each independently represent a hydrogen atom or a substituent.

Examples of the substituent represented by each of $R^{100}$ and $R^{101}$ include an alkyl group, an aryl group, and a heterocyclic group, with the alkyl group being preferable. The number of carbon atoms of the alkyl group is preferably 1 to 10, more preferably 1 to 5, and still more preferably 1 to 3. The alkyl group is preferably linear or branched, and more preferably linear.

Examples of the substituent represented by each of $R^{a1}$ to $R^{a6}$, and $R^{b1}$ to $R^{b10}$ include an alkyl group and a nitro group.

Examples of the divalent linking group represented by $A^1$ include an alkylene group, $-O-$, $-CO-$, $-OCO-$, $-COO-$, $-SO_2-$, $-SO-$, $-S-$, and a group formed by a combination thereof. The number of carbon atoms of the alkylene group is preferably 1 to 10, and more preferably 1 to 5. The alkylene group is preferably linear or branched. The alkylene group may be unsubstituted or may have a substituent. Examples of the substituent include a halogen atom.

Specific examples of the aromatic amine compound include aniline, N,N-dimethyl aniline, N-ethyl-N-methylaniline, N,N-diethylaniline, 4-nitroaniline, N,N-dimethyl-4-nitroaniline, 4,4'-diaminobiphenyl, 3,5-bistrifluoromethyl-1,2-diaminobenzene, 2,2-bis(4-aminophenyl)hexafluoropropane, 2,3-bis(4-aminophenyl) succinonitrile, 4,4'-diaminobenzophenone, 4,4'-diaminophenylbenzoate, 4,4'-diaminodiphenylsulfone, 1,4-diamino-2-chlorobenzene, 1,4-diamino-2-bromobenzene, 1,4-diamino-2-iodobenzene, 1,4-diamino-2-nitrobenzene, 1,4-diamino-2-trifluoromethylbenzene, 2,5-diaminobenzonitrile, 2,5-diaminoacetophenone, 2,5-diaminobenzoic acid, 2,2'-dichlorobenzidine, 2,2'-dibromobenzidine, 2,2'-diiodobenzidine, 2,2'-dinitrobenzidine, 2,2'-bis(trifluoromethyl)benzidine, ethyl 3-aminobenzenesulfonate, N,N-dimethylbenzylamine, triphenylamine, trinaphthylamine, N-phenyl-N-methylaniline, N,N-dimethyl-paratoluidine, N,N-dimethyl-4-bromoaniline, and N,N-dimethyl-4-methoxyaniline.

(Thiol Compound)

Examples of the thiol compound include a polyfunctional thiol compound having two or more mercapto groups in a molecule thereof. The polyfunctional thiol compounds may also be added for the purpose of improving stability, odor, resolution, developability, adhesiveness, or the like. The polyfunctional thiol compounds are preferably secondary alkanethiols, and particularly preferably a compound having a structure represented by Formula (T1).

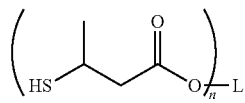

Formula (T1)

(In Formula (T1), n represents an integer of 2 to 4, and L represents a divalent to tetravalent linking group.)

In Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compounds are compounds represented by Structural Formulae (T2) to (T4), with the compound represented by Formula (T2) being particularly preferable. The thiol compounds can be used singly or in combination of a plurality of kinds thereof.

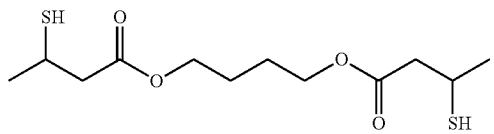

(T2)

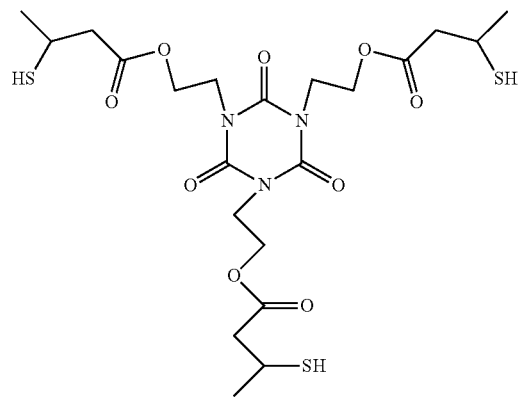

(T3)

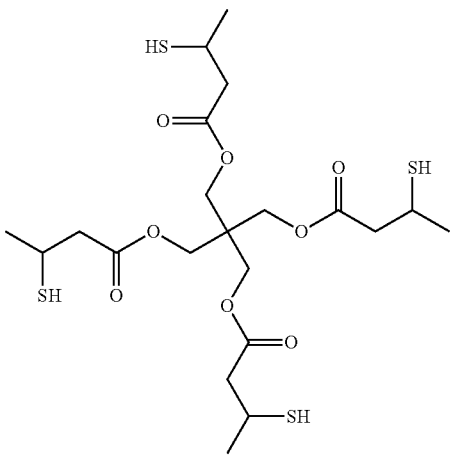

(T4)

Moreover, as the curing accelerator, a methylol-based compound (for example, the compounds exemplified as a crosslinking agent in paragraph No. 0246 of JP2015-34963A), amines, phosphonium salts, amidine salts, amide compounds (each of which are the curing agents described in, for example, paragraph No. 0186 of JP2013-41165A), base generators (for example, the ionic compounds described in JP2014-55114A), cyanate compounds (for example, the compounds described in paragraph No. 0071 of JP2012-150180A), alkoxysilane compounds (for example, the alkoxysilane compounds having epoxy groups, described in JP2011-253054A), onium salt compounds (for example, the compounds exemplified as an acid generator in paragraph No. 0216 of JP2015-34963A, and the compounds described in JP2009-180949A), or the like can also be used.

In a case where the coloring composition of the present invention contains the curing accelerator, the content of the curing accelerator is preferably 0.3% to 8.9% by mass, and more preferably 0.8% to 6.4% by mass, with respect to the total solid content of the coloring composition.

Furthermore, in a case where the curable compound is an epoxy compound, the content of the aromatic amine compound is preferably 2 to 6 parts by mass, and more preferably 1 to 10 parts by mass, with respect to 100 parts by mass of the epoxy compound. According to this aspect, good curability is easily obtained.

<<Photopolymerization Initiator>>

It is preferable that the coloring composition of the present invention further contains a photopolymerization initiator. The photopolymerization initiator is not particularly limited as long as it can initiate the polymerization of polymerizable compounds, and can be appropriately selected from known photopolymerization initiators. For example, it is preferably sensitive to radiations from ultraviolet rays to visible regions. Further, it may be an activator that causes a certain action with a photoexcited sensitizer to generate active radicals. Incidentally, the photopolymerization initiator preferably contains at least one compound having a molecular light absorption coefficient of at least about 50 in the range of about 300 nm to 800 nm (more preferably 330 nm to 500 nm).

Examples of the photopolymerization initiator include halogenated hydrocarbon derivatives (for example, a compound having a triazine skeleton and a compound having an oxadiazole skeleton), acylphosphine compounds such as acylphosphine oxide, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone.

Moreover, from the viewpoint of the exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-291969A), and the acylphosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) which are commercially available can be used. As the aminoacetophenone-based initiator, IRGACURE-907, IRGACURE-369, and IRGACURE-379 (trade names: all manufactured by BASF) which are commercially available products can be used. In addition, as the aminoacetophenone-based initiator, the compound described in JP2009-191179A, of which an absorption wavelength matches with a light source at a wavelength of 365 nm, 405 nm, or the like can be used. In addition, as the acylphosphine-based initiator, IRGACURE-819 or DAROCUR-TPO (trade names, both manufactured by BASF) which is a commercially available product can be used.

In particular, in a case where the coloring composition of the present invention is used to manufacture a color filter for a solid-state imaging device, it is important that it should be not only readily curable but also developable without leaving residues in unexposed areas since it is necessary to form micropatterns in sharp shapes. From such a viewpoint, it is particularly preferable to use an oxime compound as a photopolymerization initiator. In particular, in a case where micropatterns are formed in a solid-state imaging device, a stepper exposure machine is used for curing exposure, but such an exposure machine may be damaged by halogen, and thus, it is necessary to reduce the addition amount of the photopolymerization initiator. Thus, taking these points into consideration, it is particularly preferable to use the oxime compound as the photopolymerization initiator in a case of forming micropatterns as in a solid-state imaging device or the like.

With respect to specific examples of the photopolymerization initiator, reference can be made to, for example, paragraph Nos. 0265 to 0268 of JP2013-29760A, the contents of which are incorporated herein by reference.

More preferred examples of the photopolymerization initiator include an oxime compound. As the specific examples of the oxime compound, the compound described in JP2001-233842A, the compound described in JP2000-80068A, or the compound described in JP2006-342166A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653 to 1660, J. C. S. Perkin II (1979), pp. 156 to 162, Journal of Photopolymer Science and Technology (1995), pp. 202 to 232, the compounds described in JP2000-66385A, the compounds described in each of the publications of JP2000-80068A, JP2004-534797A, and JP2006-342166A, or the like can also be used.

As the commercially available products thereof, IRGACURE-OXE01 and IRGACURE-OXE02 (both manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 (manufactured by ADEKA Corporation) can also be used.

Furthermore, as oxime compounds other than the above-described oxime compounds, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a colorant moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of g-rays, and the like, may be used. Preferably, reference can be made to the descriptions in, for example, paragraph Nos. 0274 and 0275 of JP2013-29760A, the contents of which are incorporated herein by reference. Specifically, as the oxime compound, a compound represented by Formula (OX-1) is preferable. In addition, the compound may be an oxime compound in which an N—O bond of oxime forms an (E) isomer, an oxime compound in which an N—O bond of oxime forms a (Z) isomer, or an oxime compound in which an N—O bond of oxime forms a mixture of the (E) isomer and the (Z) isomer.

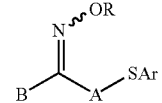

(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above-mentioned substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in Formula (OX-1), an alkylene group having 1 to 12 carbon atoms, or an alkynylene group is preferable. These groups may have one or more substituents. Examples of the substituent include the above-mentioned substituents.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference.

In the present invention, an oxime compound having a nitro group can be used as the photopolymerization initiator. The oxime compound having a nitro group is preferably in the form of a dimer. Specific examples of the oxime compound having a nitro group include the compounds described in paragraph Nos. 0031 to 0047 of JP2013-114249A, the compounds described in paragraph Nos. 0008 to 0012, and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

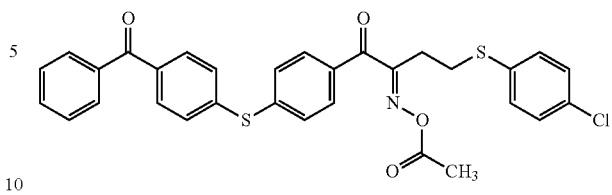

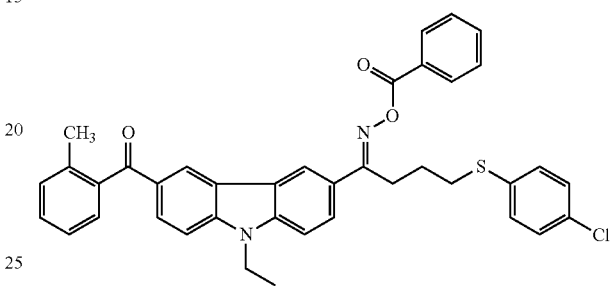

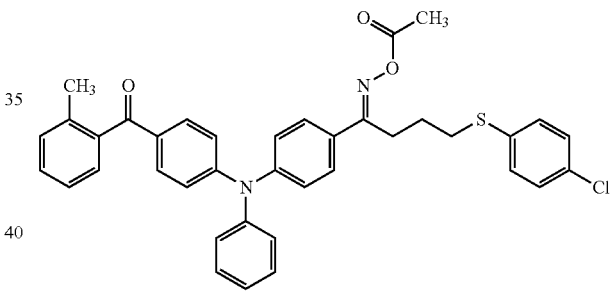

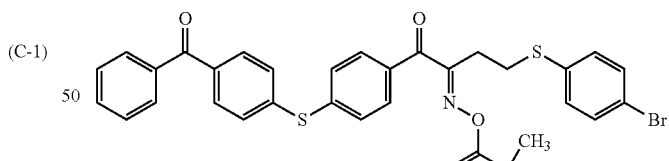

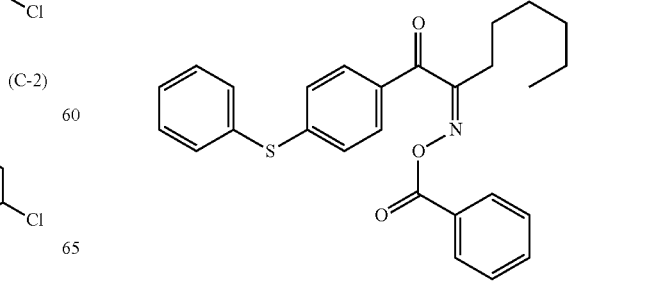

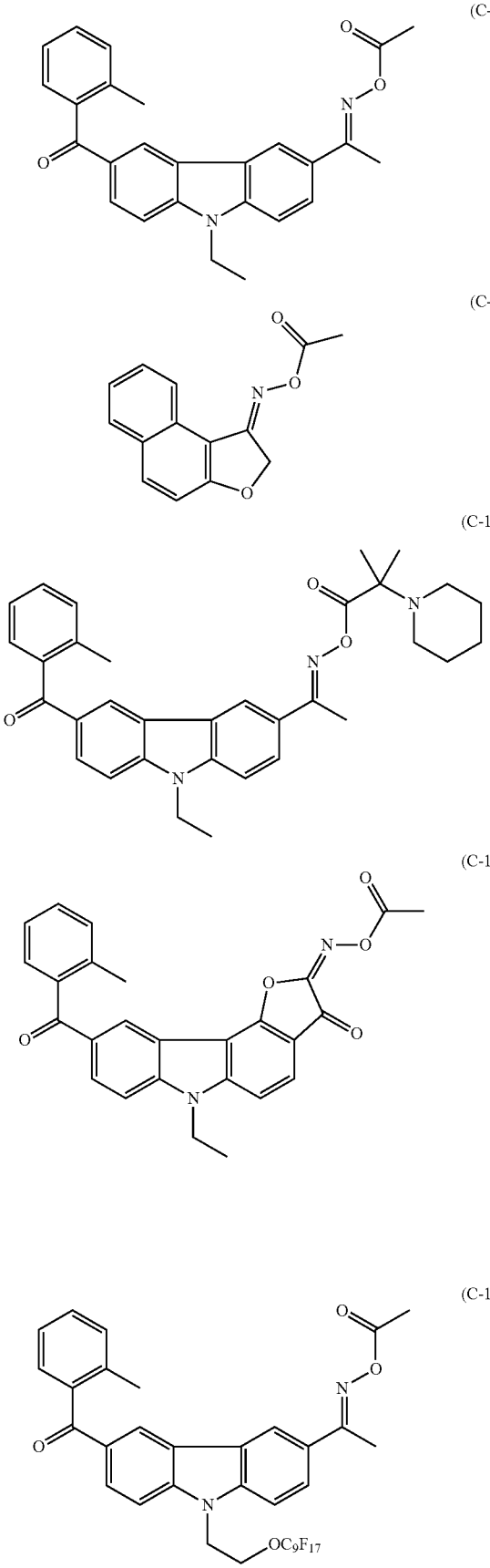
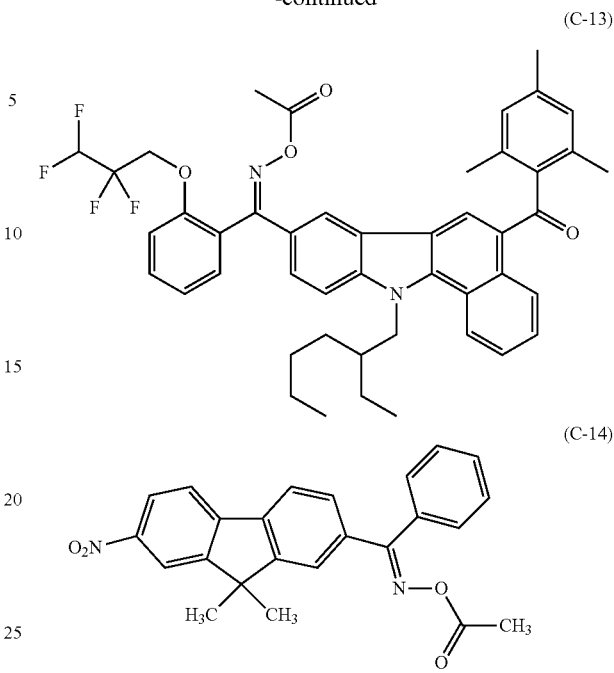

As the oxime compound, the compound having a maximum absorption wavelength in a wavelength range of 350 nm to 500 nm is preferable, the compound having an absorption wavelength in a wavelength range of 360 nm to 480 nm is more preferable, and the compound having a high absorbance at 365 nm and 405 nm is particularly preferable.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of an ultraviolet and visible light spectrophotometer (Cary-5 spectrophotometer manufactured by Varian) at a concentration of 0.01 g/L using an ethyl acetate solvent.

The photopolymerization initiator may be used in combination of two or more kinds thereof, as desired.

In a case where the coloring composition of the present invention contains a photopolymerization initiator, the content of the photopolymerization initiator is preferably 0.1% to 50% by mass, more preferably 0.5% to 30% by mass, and still more preferably 1% to 20% by mass, with respect to the total solid content of the coloring composition. Within this range, better sensitivity and pattern forming properties are obtained. The coloring composition of the present invention may include one kind or two or more kinds of the photopolymerization initiators. In a case where two or more kinds of the photopolymerization initiators are included, a total amount thereof preferably falls within the range.

<<Pigment Derivative>>

The coloring composition of the present invention preferably contains a pigment derivative. Examples of the pigment derivative include a compound having a structure in which a portion of an organic pigment is substituted with an acidic group, a basic group, or a phthalimidomethyl group. As the pigment derivative, a pigment derivative having an acidic group or a basic group is preferable from the viewpoint of dispersibility and the dispersion stability, and a pigment derivative having a basic group is particularly preferable. Further, a combination of the above-mentioned resin (dispersant) and the pigment derivative is preferably a combination in which the resin is an acidic resin having an acid group and the pigment derivative has a basic group.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment. In addition, the acidic group contained in the pigment derivative is preferably a sulfonic acid group, a carboxylic acid group, or a quaternary ammonium base group thereof, more preferably a carboxylic acid group or a sulfonic acid group, and particularly preferably a sulfonic acid group. The basic group contained in the pigment derivative is preferably an amino group, and particularly preferably a tertiary amino group. Specific examples of the pigment derivative include the following compounds. Further, reference can be made to the descriptions in paragraph Nos. 0162 to 0183 of JP2011-252065A, the contents of which are incorporated herein by reference.

surfactant has been applied, the interface tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the like, and the solubility of the surfactant in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and RS-72-K (all manufactured by DIC Corporation), FLUORAD FC430, FC431, and FC171 (all manufactured by Sumitomo 3M), SURFLON S-382, SURFLON SC-101, SURFLON SC-103, SURFLON SC-104, SURFLON

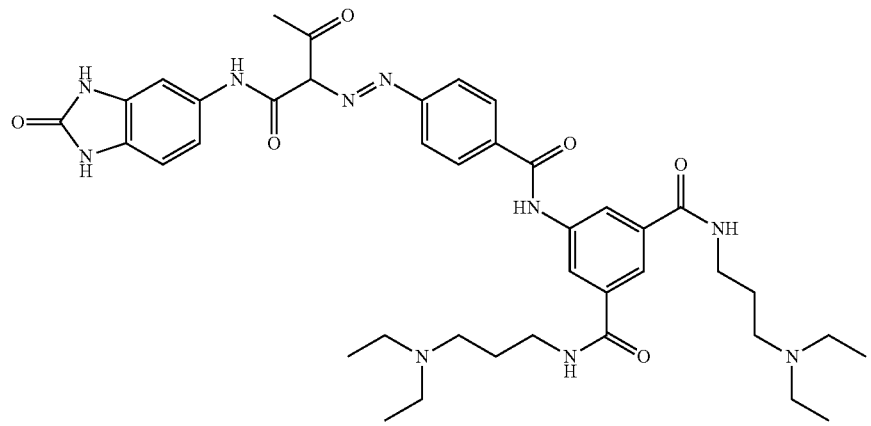 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

The content of the pigment derivative in the coloring composition of the present invention is preferably 1% to 30% by mass, and more preferably 3% to 20% by mass, with respect to the total mass of the pigment. The pigment derivative may be used singly or in combination of two or more kinds thereof.

<<Surfactant>>

From the viewpoint of further improving coatability, the coloring composition of the present invention may contain various surfactants. As the surfactant, various surfactants such as a fluorine-based surfactant, a non-ionic surfactant, a cationic surfactant, an anionic surfactant, and a silicone-based surfactant can be used.

By incorporating a fluorine-based surfactant into the coloring composition of the present invention, liquid characteristics (in particular, fluidity) in a case of preparation of a coating liquid using the coloring composition are further improved, and thus, the evenness of coating thickness or liquid saving properties can be further improved. That is, in a case where a film is formed using the coating liquid to which a coloring composition containing a fluorine-based SC-105, SURFLON SC-1068, SURFLON SC-381, SURFLON SC-383, SURFLON S-393, and SURFLON KH-40 (all manufactured by ASAHI GLASS Co., Ltd.), and PF636, PF656, PF6320, PF6520, and PF7002 (manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used. As the fluorine-based surfactant, a block polymer can also be used, and specific examples thereof include the compounds described in JP2011-89090A.

The fluorine-based surfactant can also preferably use a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

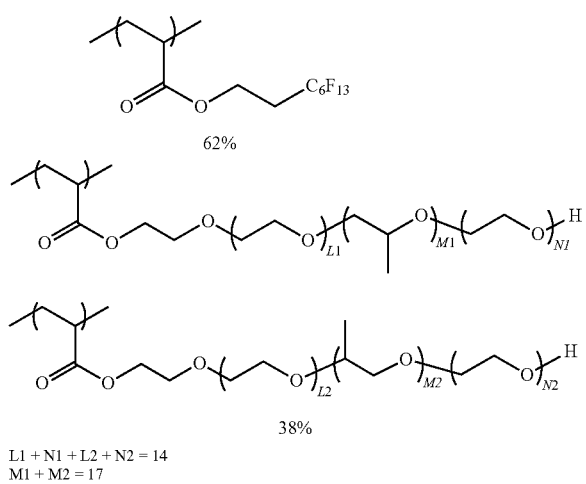

L1 + N1 + L2 + N2 = 14
M1 + M2 = 17

The weight-average molecular weight of the compounds is preferably 3,000 to 50,000, and is, for example, 14,000.

With regard to the fluorine-based surfactant, a fluorine-containing polymer having an ethylenically unsaturated group in a side chain can also be used as the fluorine-based surfactant. Specific examples thereof include the compounds described in paragraph Nos. 0050 to 0090, and 0289 to 0295 of JP2010-164965A, such as MEGAFACE RS-101, RS-102, and RS-718K, all manufactured by DIC Corporation.

Examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, or NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Specific examples of the cationic surfactant include an organosiloxane polymer KP-341 (manufactured by Shin-Etsu Chemical Co., Ltd.), a (meth)acrylic acid-based (co) polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP-341, KF-6001, and KF-6002 (all manufactured by Shin-Etsu Chemical Co., Ltd.), and BYK307, BYK323, and BYK330 (all manufactured by BYK Chemie).

The surfactants may be used singly or in combination of two or more kinds thereof.

The content of the surfactant is preferably 0.001% to 2.0% by mass, and more preferably 0.005% to 1.0% by mass, with respect to the total solid content of the coloring composition.

<<Silane Coupling Agent>>

The coloring composition of the present invention can contain a silane coupling agent as a component other than the curable compound. Further, in the present invention, the silane coupling agent means a silane compound having a hydrolyzable group and other functional groups. Further, the hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, and an acyloxy group.

The silane coupling agent is also preferably a silane compound having, as the functional group, an amino group and an alkoxy group. Examples of such an silane coupling agent include N-β-aminoethyl-γ-aminopropylmethyldimethoxysilane (trade name KBM-602, manufactured by Shin-Etsu Chemical Co., Ltd.), N-β-aminoethyl-γ-aminopropyltrimethoxysilane (trade name KBM-603, manufactured by Shin-Etsu Chemical Co., Ltd.), N-β-aminoethyl-γ-aminopropyltriethoxysilane (trade name KBE-602, manufactured by Shin-Etsu Chemical Co., Ltd.), γ-aminopropyltrimethoxysilane (trade name KBM-903, manufactured by Shin-Etsu Chemical Co., Ltd.), γ-aminopropyltriethoxysilane (trade name KBE-903, manufactured by Shin-Etsu Chemical Co., Ltd.), and 3-methacryloxypropyltrimethoxysilane (trade name KBM-503, manufactured by Shin-Etsu Chemical Co., Ltd.). With regard to the details of the silane coupling agent, reference can be made to the descriptions in paragraph Nos. 0155 to 0158 of JP2013-254047A, the contents of which are incorporated herein by reference.

In a case where the coloring composition of the present invention includes a silane coupling agent, the content of the silane coupling agent is preferably 0.001% to 20% by mass, more preferably 0.01% to 10% by mass, and particularly preferably 0.1% by mass to 5% by mass, with respect to the total solid content of the coloring composition. The coloring composition of the present invention may include one kind or two or more kinds of the silane coupling agents. In a case where two or more kinds of the silane coupling agents are included, a total amount thereof preferably falls within the range.

<<Polymerization Inhibitor>>

It is also preferable that to the coloring composition of the present invention contains a polymerization inhibitor. Examples of the polymerization inhibitor include hydroquinone, paramethoxyphenol, di-t-butyl-paracresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine salt (an ammonium salt, a cerous salt, or the like).

In a case where the coloring composition of the present invention contains a polymerization inhibitor, the content of the polymerization inhibitor is preferably 0.01% to 5% by mass with respect to the total solid content of the coloring composition. The coloring composition of the present invention may include one kind or two or more kinds of the polymerization inhibitor. In a case where two or more kinds of the polymerization inhibitors are included, a total amount thereof preferably falls within the range.

<<Other Additives>>

Various additives, for example, a filler, an adhesion promoter, an antioxidant, an ultraviolet absorber, and an aggregation inhibitor can be blended into the coloring composition of the present invention, as desired. Examples of these additives include those described in paragraph Nos. 0155 and 0156 of JP2004-295116A, the contents of which are incorporated herein by reference. As the antioxidant, for example, a phenol compound, a phosphorus-based compound (for example, the compounds described in paragraph No. 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used as a mixture of two or more kinds thereof. The coloring composition of the present invention may contain the sensitizers or the light stabilizers described in paragraph No. 0078 of JP2004-295116A, or the thermal polymerization inhibitors described in paragraph No. 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm or less, and preferably controlled to 0.01 to 10 ppm. Further, the total amount of the inorganic metal salts in the coloring composition is preferably 100 ppm or less, and preferably controlled to 0.5 to 50 ppm.

<Method for Preparing Coloring Composition>

The coloring composition of the present invention can be prepared by mixing the above-mentioned components. In the preparation of the coloring composition, the respective components may be blended at once, or the respective components may be dissolved and/or dispersed in a solvent, and then sequentially blended. Further, the order of the components to be introduced or the operational conditions during the blending is not particularly limited. For example, the composition may be prepared by dissolving and/or dispersing all the components in a solvent at the same time, or by appropriately leaving the respective components in two or more solutions or dispersion liquids, and mixing them into a solution during the use (during the coating), as desired.

It is preferable that in the production of the coloring composition, filtration is performed using a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density and ultrahigh-molecular-weight polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter of the filter to the range, fine foreign matters which inhibit the preparation of a uniform and smooth film in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filteration through the second filtration may be carried out.

The coloring composition of the present invention can also be used after its viscosity is adjusted for the purposes of adjusting the state of a film surface (flatness or the like), adjusting a film thickness, or the like. The value of the viscosity can be appropriately selected as desired, and is, for example, preferably 0.3 to 50 mPa·s, and more preferably 0.5 to 20 mPa·s at 25° C. As for a method for measuring the viscosity, the viscosity can be measured, for example, with a temperature being adjusted to 25° C., using a viscometer RE85L (rotor: 1°34'×R24, measurement range of 0.6 to 1,200 mPa·s) manufactured by Toki Sangyo Co., Ltd.

The moisture content in the coloring composition of the present invention is usually 3% by mass or less, preferably 0.01% to 1.5% by mass, and more preferably 0.1% to 1.0% by mass. In addition, the moisture content is a value measured by a Karl Fischer method.

<Color Filter>

Next, the color filter of the present invention will be described.

The color filter of the present invention is formed using the above-mentioned coloring composition of the present invention. The film thickness of the color filter of the present invention can be appropriately adjusted, depending on the purposes. The film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more. The color filter of the present invention can be used for a solid-state imaging device such as a charge-coupled device (CCD) and a complementary metal-oxide semiconductor (CMOS), an image display device, or the like.

In a case where the color filter of the present invention is used in applications for a liquid crystal display device, the voltage holding ratio of a liquid crystal display element including a color filter is preferably 70% or more, and more preferably 90% or more. Known means for obtaining a high voltage holding ratio can be incorporated as appropriate, and examples of typical means include a use of high-purity materials (for example, reduction in ionic impurities) and a control of the amount of acidic functional groups in a composition. The voltage holding ratio can be measured by, for example, the methods described in paragraph No. 0243 of JP2011-008004A, and paragraph Nos. 0123 to 0129 of JP2012-224847A.

<Pattern Forming Method>

The pattern forming method of the present invention includes a step of forming a coloring composition layer on a support using the coloring composition of the present invention, and a step of forming a pattern onto the coloring composition layer by a photolithographic method or a dry etching method.

Pattern formation using a photolithographic method preferably includes a step of forming a coloring composition layer on a support using the coloring composition, a step of patternwise exposing the coloring composition layer, and a step of removing unexposed areas by development to form a pattern. A step of baking the coloring composition layer (pre-baking step), and a step of baking the developed pattern (post-baking step) may be provided, as desired.

Furthermore, pattern formation using a dry etching method preferably includes a step of forming a coloring composition layer on a support using the coloring composition, and performing curing to form a cured product layer, a step of forming a photoresist layer on the cured product layer, a step of performing exposure and development to pattern the photoresist layer, thereby obtaining a resist pattern, and a step of dry-etching the cured product layer using the resist pattern as an etching mask to form a pattern. Hereinafter, the respective steps will be described.

<<Step of Forming Coloring Composition Layer>>

In the step of forming a coloring composition layer, the coloring composition layer is formed on a support, using the coloring composition.

It is possible to use a substrate for a solid-state imaging device, in which a solid-state imaging device (light-receiving element) such as a CCD and a CMOS is provided onto a substrate (for example, a silicon substrate) as the support.

The coloring composition layer may be formed on the side (front surface) of a substrate for a solid-state imaging device, on which a solid-state imaging device is formed, or may be formed on the side (rear surface) on which a solid-state imaging device is not formed.

An undercoat layer may be provided on the support, as desired, so as to improve adhesiveness with a layer above the support, to prevent diffusion of materials, or to make a surface of the substrate flat.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed.

In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials.

The pre-baking time is preferably 10 seconds to 300 seconds, more preferably 40 to 250 seconds, and still more preferably 80 to 220 seconds. Drying can be performed using a hot plate, an oven, or the like.

(Case of Forming Pattern by Photolithographic Method)

<<Exposing Step>>

Next, the coloring composition layer is patternwise exposed (exposing step). For example, the coloring composition layer can be subjected to patternwise exposure by performing exposure using an exposure device such as a stepper through a mask having a predetermined mask pattern. Thus, the exposed portion can be cured.

As the radiation (light) which can be used during the exposure, ultraviolet rays such as g-rays and i-rays (particularly preferably i-rays) are preferably used. The irradiation dose (exposure dose) is, for example, preferably 0.03 to 2.5 $J/cm^2$, and more preferably 0.05 to 1.0 $J/cm^2$.

The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 $W/m^2$ to 100,000 $W/m^2$ (for example, 5,000 $W/m^2$, 15,000 $W/m^2$, or 35,000 $W/m^2$). Appropriate conditions of each of the oxygen concentration and the exposure illuminance may be combined, and for example, a combination of the oxygen concentration of 10% by volume and the illuminance of 10,000 $W/m^2$, a combination of the oxygen concentration of 35% by volume and the illuminance of 20,000 $W/m^2$, or the like is available.

<<Developing Step>>

Next, the unexposed area is removed by development to form a pattern. The removal of the unexposed area by development can be carried out using a developer. Thus, the coloring composition layer of the unexposed area in the exposing step is eluted into the developer, and as a result, only a photocured portion remains.

As the developer, an organic alkali developer causing no damage on the underlying solid-state imaging device, circuit, or the like is preferable.

The temperature of the developer is preferably, for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as aqueous ammonia, ethylamine, diethylamine, dimethylethanolamine, diglycol amine, diethanolamine, hydroxylamine, ethylenediamine, tetramethylammonium hydroxide, tetraethylammonium hydroxide, tetrapropylammoniumhydroxide, tetrabutylammoniumhydroxide, benzyltrimethylammonium hydroxide, dimethylbis(2-hydroxyethyl)ammonium hydroxide, choline, pyrrole, piperidine, and 1,8-diazabicyclo-[5.4.0]-7-undecene. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass.

In addition, an inorganic alkali may be used as the alkali agent in a developer. As the inorganic alkali, sodium hydroxide, potassium hydroxide, sodium carbonate, sodium hydrogen carbonate, sodium silicate, sodium metasilicate, or the like is preferable.

Moreover, a surfactant may also be added to the developer. Examples of the surfactant include the surfactants described as the above-mentioned curable composition, with a non-ionic surfactant being preferable.

Incidentally, in a case where a developer formed of such an aqueous alkaline solution is used, it is preferable that washing (rinsing) with pure water is generally performed after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. The Young's modulus of the film after post-baking is preferably 0.5 to 20 GPa, and more preferably 2.5 to 15 GPa. In addition, in a case of using an organic electroluminescence (organic EL) element as a light-emitting light source or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher.

The post-baking can be carried out continuously or batch-wise by using a heating means such as a hot plate, a convection oven (hot-air circulating dryer), and a high-frequency heater so that the film after development satisfies the conditions. Further, in a case of forming a pattern by a low-temperature process, the post-baking may not be carried out.

(Case of Forming Pattern by Dry Etching Method)

Pattern formation by a dry etching method can be carried out by curing a coloring composition layer formed on a support to form a cured product layer, then forming a patterned photoresist layer on the obtained cured product layer, and dry-etching the cured product layer using the patterned photoresist layer as a mask and an etching gas. With regard to the pattern formation by a dry etching method, reference can be made to the descriptions in paragraph Nos. 0010 to 0067 of JP2013-064993A, the contents of which are incorporated herein by reference.

<Solid-State Imaging Device>

The solid-state imaging device of the present invention has the above-mentioned color filter of the present invention. The configuration of the solid-state imaging device of the present invention is not particularly limited as long as the solid-state imaging device is configured to include the color filter of the present invention and function as a solid-state imaging device. However, examples thereof include the following configurations.

The solid-state imaging device is configured to have a plurality of photodiodes constituting a light receiving area of the solid-state imaging device (a charge-coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiode, on the photodiodes and the transfer electrodes; have a device-protective film formed of silicon nitride or the like, which is formed to cover the entire surface of the light-shielding film and the light receiving portion of the photodiodes, on the light-shielding film; and have a color filter on the device-protective film. In addition, the solid-state imaging device may also be configured, for example, such that it has a light collecting means (for example, a microlens, which is the same hereinafter) on a device-protective film under a color filter (a side closer to the substrate), or has a light-collecting means on a color filter.

<Image Display Device>

The color filter of the present invention can also be used for an image display device such as a liquid crystal display device and an organic electroluminescence display device. The definitions of display devices and the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

EXAMPLES

Hereinbelow, the present invention will be described in more detail with reference to Examples. The materials, the amounts of materials to be used, the proportions, the treatment details, the treatment procedure, or the like shown in the Examples below may be modified if appropriate as long as the modifications do not depart from the spirit of the present invention. Therefore, the scope of the present invention should not be construed as being limited to the specific Examples shown below. In addition, "parts" and "%" are on a mass basis unless otherwise specified.

<Measurement of Weight-Average Molecular Weight>

The weight-average molecular weight of the resin was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow rate (amount of a sample to be injected): 1.0 µL (sample concentration: 0.1% by mass)

Device name: HLC-8220GPC manufactured by Tosoh Corporation

Detector: Refractive index (RI) detector

Calibration curve base resin: Polystyrene

<Preparation of Pigment Dispersion Liquid>

(Pigment Dispersion Liquid 1)

A mixed solution including a blend of the following materials was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment liquid 1.

C. I. Pigment Green 58 . . . 6.6 parts by mass

C. I. Pigment Yellow 150 . . . 6.3 parts by mass

Resin 1: The following structure (weight-average molecular weight of 10,000) . . . 8.8 parts by mass

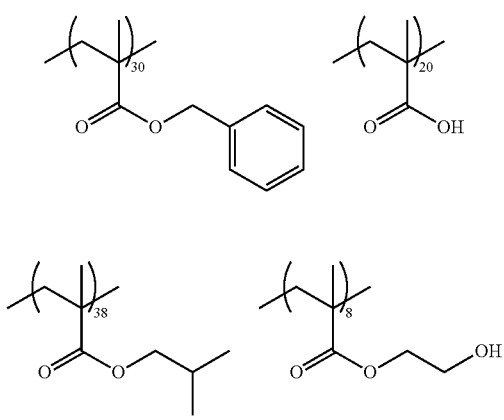

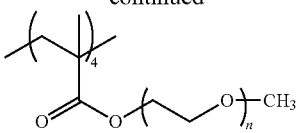

n: average 9

Solvent (propylene glycol monomethyl ether acetate) . . . 72.7 parts by mass
Solvent (cyclohexanone) . . . 6.2 parts by mass
(Pigment Dispersion Liquid 2)
A mixed solution including a blend of the following materials was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment liquid 2.

Halogenated zinc phthalocyanine pigment (bromine atoms:chlorine atoms:hydrogen atoms=10:3:3) . . . 8.6 parts by mass
C. I. Pigment Yellow 150 . . . 4.3 parts by mass
Resin 1 . . . 8.8 parts by mass
Solvent (propylene glycol monomethyl ether acetate) . . . 72.7 parts by mass
Solvent (cyclohexanone) . . . 6.2 parts by mass
(Pigment Dispersion Liquid 3)
A mixed solution including a blend of the following materials was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a pigment liquid 3.

C. I. Pigment Green 58 . . . 15 parts by mass
Pigment derivative 1 . . . 0.5 parts by mass
Resin 2 . . . 7.0 parts by mass
Propylene glycol monomethyl ether acetate (PGMEA) . . . 90 parts by mass Pigment derivative 1: Compound with the following structure

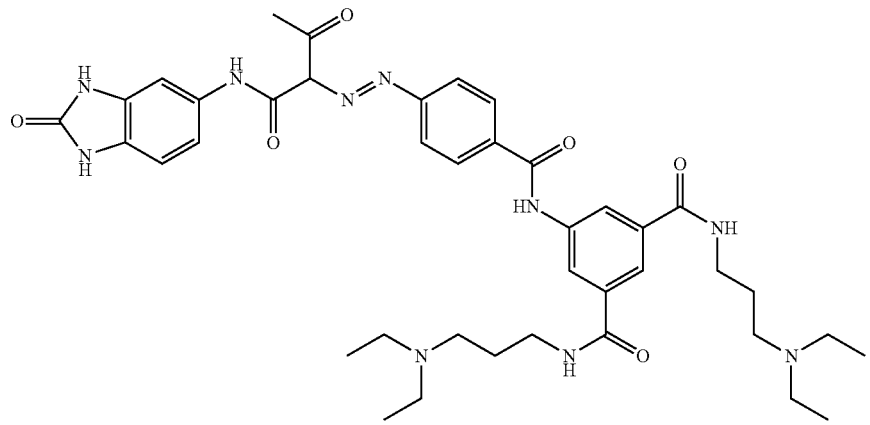 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Resin 2: Resin having the following structure (the acid value is 10 mgKOH/g, and the weight-average molecular weight (Mw) is 20,000; a and b each represent the number of partial structures shown in the parentheses, a represents 2, and b represents 4)

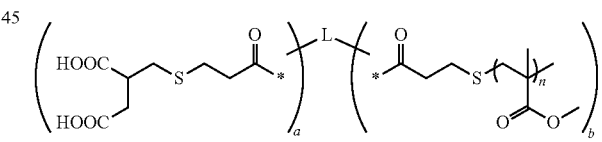

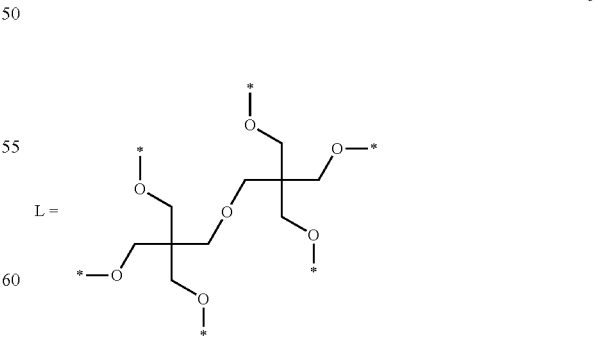

<Preparation of Coloring Composition>

The following components were mixed to produce a coloring composition.

TABLE 1

|  |  |  | Example 1 | Example 2 | Example 3 | Example 4 | Example 5 | Example 6 | Example 7 | Example 8 |
|---|---|---|---|---|---|---|---|---|---|---|
| Pigment dispersion liquid | | Pigment dispersion liquid 1 | 83 | 83 | 83 | 81 | 81 | 83 | 83 | 81 |
| | | Pigment dispersion liquid 2 | | | | | | | | |
| Yellow colorant | | Y-1 | | | | 2 | | | | |
| | | Y-2 | | | | | 2 | | | 2 |
| Curable compound | Epoxy compound | B-1 | 0.7 | 0.7 | | | 0.7 | 0.7 | 0.7 | 0.7 |
| | | B-2 | | | 0.7 | 0.7 | | | | |
| | Polymerizable polymer | C-1 | 0.7 | 0.7 | 0.7 | 0.7 | | | | |
| | | C-2 | | | | | 0.7 | 0.7 | 0.7 | 0.7 |
| | Polymerizable monomer | D-1 | 2.8 | 2.8 | | | | | 2.8 | 2.8 |
| | | D-2 | | | 2.8 | 2.8 | | | | |
| | | D-3 | | | | | 2.8 | 2.8 | | |
| Solvent | | E-1 | 11.2 | 11.2 | 11.1 | 11.2 | 11.2 | | | 11.2 |
| | | E-2 | | | | | | 11.2 | 11.2 | |
| Maleimide compound | | F-1 | 0.014 | 0.028 | 0.056 | | | | | |
| | | F-2 | | | | 0.028 | | | 0.028 | 0.028 |
| | | F-3 | | | | | | | | |
| | | F-4 | | | | | 0.028 | 0.028 | | |
| | | F-5 | | | | | | | | |
| Aromatic amine | | G-1 | 0.4 | 0.4 | 0.4 | | | | 0.4 | 0.4 |
| | | G-2 | | | | 0.4 | | | | |
| | | G-3 | | | | | 0.4 | 0.4 | | |
| Photopolymerization initiator | | H-1 | 1.2 | 1.2 | 1.2 | 1.2 | 1.2 | 1.2 | | |
| | | H-2 | | | | | | | 1.2 | 1.2 |
| Surfactant | | I-1 | 0.05 | 0.05 | 0.05 | | 0.05 | 0.05 | 0.05 | 0.05 |
| Proportion (parts by mass) of maleimide compound with respect to 100 parts by mass of halogenated zinc phthalocyanine pigment | | | 0.13 | 0.25 | 0.51 | 0.25 | 0.25 | 0.25 | 0.25 | 0.25 |
| Proportion (% by mass) of maleimide compound with respect to total solid content of coloring composition | | | 0.06 | 0.12 | 0.25 | 0.12 | 0.12 | 0.12 | 0.12 | 0.12 |
| Proportion (parts by mass) of maleimide compound with respect to 100 parts by mass of curable compound | | | 0.33 | 0.67 | 1.33 | 0.67 | 0.67 | 0.67 | 0.67 | 0.67 |

TABLE 2

|  |  |  | Example 9 | Example 10 | Example 11 | Example 12 | Example 13 | Example 14 | Example 15 | Example 16 |
|---|---|---|---|---|---|---|---|---|---|---|
| Pigment dispersion liquid | | Pigment dispersion liquid 1 | | 83 | 83 | 83 | 83 | 83 | 83 | 83 |
| | | Pigment dispersion liquid 2 | 83 | | | | | | | |
| | | Pigment dispersion liquid 3 | | | | | | | | |
| Yellow colorant | | Y-1 | | | | | | | | |
| | | Y-2 | | | | | | | | |
| Curable compound | Epoxy compound | B-1 | 0.7 | 1.4 | | 0.7 | | | | |
| | | B-2 | | | | | | | | |
| | Polymerizable polymer | C-1 | | | 1.4 | 0.7 | 1.4 | 1.4 | 1.4 | 1.4 |
| | | C-2 | 0.7 | | | | | | | |
| | Polymerizable monomer | D-1 | 2.8 | 2.8 | 2.8 | 2.8 | 2.8 | 2.8 | 2.8 | 2.8 |
| | | D-2 | | | | | | | | |
| | | D-3 | | | | | | | | |
| Solvent | | E-1 | 11.2 | 11.2 | 11.2 | | 11.2 | 11.2 | 11.2 | 11.2 |
| | | E-2 | | | | 11.6 | | | | |
| Maleimide compound | | F-1 | 0.028 | 0.028 | 0.028 | 0.028 | 0.028 | 0.028 | 0.028 | 0.028 |
| | | F-2 | | | | | | | | |
| | | F-3 | | | | | | | | |
| | | F-4 | | | | | | | | |
| | | F-5 | | | | | | | | |
| Aromatic amine | | G-1 | 0.4 | 0.4 | 0.4 | | 0.4 | 0.4 | 0.4 | 0.4 |
| | | G-2 | | | | | | | | |
| | | G-3 | | | | | | | | |
| Photopolymerization initiator | | H-1 | | 1.2 | 1.2 | 1.2 | 1.2 | 1.2 | 1.2 | 1.2 |
| | | H-2 | 1.2 | | | | | | | |

TABLE 2-continued

|  |  | Example 9 | Example 10 | Example 11 | Example 12 | Example 13 | Example 14 | Example 15 | Example 16 |
|---|---|---|---|---|---|---|---|---|---|
| Surfactant | I-1 | 0.05 | 0.05 | 0.05 | 0.05 | 0.05 | 0.05 | 0.05 | 0.05 |
| Proportion (parts by mass) of maleimide compound with respect to 100 parts by mass of halogenated zinc phthalocyanine pigment | | 0.25 | 0.25 | 0.25 | 0.25 | 0.25 | 0.25 | 0.25 | 0.25 |
| Proportion (% by mass) of maleimide compound with respect to total solid content of coloring composition | | 0.12 | 0.12 | 0.12 | 0.13 | 0.12 | 0.12 | 0.12 | 0.12 |
| Proportion (parts by mass) of maleimid compound with respect to 100 parts by mass of curable compound | | 0.67 | 0.67 | 0.67 | 0.67 | 0.67 | 0.67 | 0.67 | 0.67 |

TABLE 3

|  |  |  | Example 17 | Example 18 | Comparative Example 1 | Comparative Example 2 | Comparative Example 3 |
|---|---|---|---|---|---|---|---|
| Pigment dispersion liquid | | Pigment dispersion liquid 1 | | | 83 | 83 | 83 |
| | | Pigment dispersion liquid 2 | 83 | | | | |
| | | Pigment dispersion liquid 3 | | 83 | | | |
| Yellow colorant | | Y-1 | | | | | |
| | | Y-2 | | | | | |
| Curable compound | Epoxy compound | B-1 | 0.7 | 0.7 | 0.7 | | 0.7 |
| | | B-2 | | | | 0.7 | |
| | Polymerizable polymer | C-1 | | 0.7 | 0.7 | 0.7 | 0.7 |
| | | C-2 | 0.7 | | | | |
| | Polymerizable monomer | D-1 | | 2.8 | 2.8 | | 2.8 |
| | | D-2 | | | | | |
| | | D-3 | 2.8 | | | 2.8 | |
| Solvent | | E-1 | 11.2 | 11.2 | 11.2 | 11.5 | 10.6 |
| | | E-2 | | | | | |
| Maleimide compound | | F-1 | | 0.014 | | | 1 |
| | | F-2 | | | | | |
| | | F-3 | | | | | |
| | | F-4 | 0.028 | | | | |
| | | F-5 | | | | 0.028 | |
| Aromatic amine | | G-1 | | 0.4 | 0.4 | | |
| | | G-2 | | | | | |
| | | G-3 | 0.4 | | | | |
| Photopolymerization initiator | | H-1 | 1.2 | 1.2 | 1.2 | 1.2 | 1.2 |
| | | H-2 | | | | | |
| Surfactant | | I-1 | 0.05 | 0.05 | | 0.05 | |
| Proportion (parts by mass) of maleimide compound with respect to 100 parts by mass of halogenated zinc phthalocyanine pigment | | | 0.25 | 0.13 | 0.00 | 0.25 | 9.04 |
| Proportion (% by mass) of maleimide compound with respect to total solid content of coloring composition | | | 0.12 | 0.06 | 0.00 | 0.13 | 4.35 |
| Proportion (parts by mass) of maleimide compound with respect to 100 parts by mass of curable compound | | | 0.67 | 0.33 | 0.00 | 0.67 | 23.81 |

The raw materials in the tables are as follows.

(Curable Compounds)

Epoxy Compounds

B-1: EHPE3150 (manufactured by Daicel Chemical Industries, Ltd., molecular weight=2,234)

B-2: Glycidyl trityl ether (manufactured by Tokyo Kasei Kogyo Co., Ltd.)

Polymerizable Polymers

C-1: ACRYCURE RD-F8 (manufactured by Nippon Shokubai Co., Ltd., polymer having an ethylenically unsaturated bond)

C-2: DP-1305 (manufactured by FUJIFILM Finechemicals Co., Ltd., polymer having an ethylenically unsaturated bond)

Polymerizable Monomers

D-1: KAYARAD DPHA (manufactured by Nippon Kayaku Co., Ltd.)

D-2: ARONIX TO-2349 (manufactured by Toagosei Chemical Industry Co., Ltd.)

D-3: NK ESTER A-DPH-12E (manufactured by Shin-Nakamura Chemical Co., Ltd.)

(Solvents)

E-1: Propylene glycol monomethyl ether acetate (PGMEA)

E-2: Cyclohexanone (Maleimide Compounds)

F-1: Methylmaleimide (molecular weight of 111)

F-2: N-Phenylmaleimide (molecular weight of 173)

F-3: N-Benzylmaleimide (molecular weight of 187)

F-4: N-tert-Butylmaleimide (molecular weight of 153)

F-5: Biotin-polyethylene glycol-maleimide (molecular weight of 3,400)

(Aromatic Amines)

G-1: 3,5-Bistrifluoromethyl-1,2-diaminobenzene

G-2: N,N-Dimethyl-4-nitroaniline

G-3: N,N-Dimethylaniline (Photopolymerization Initiators)

H-1: IRGACURE-OXE02 (manufactured by BASF)

H-2: The following compound

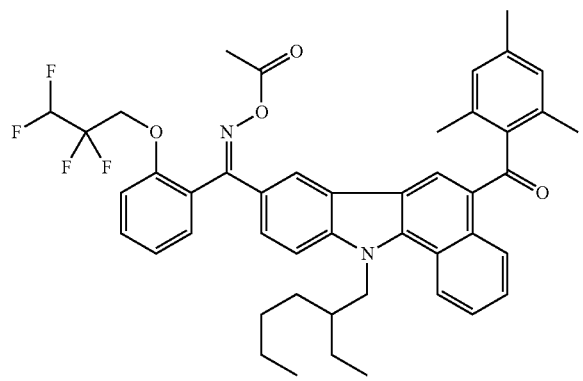 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

(Surfactant)

I-1: The following mixture (Mw=14,000)

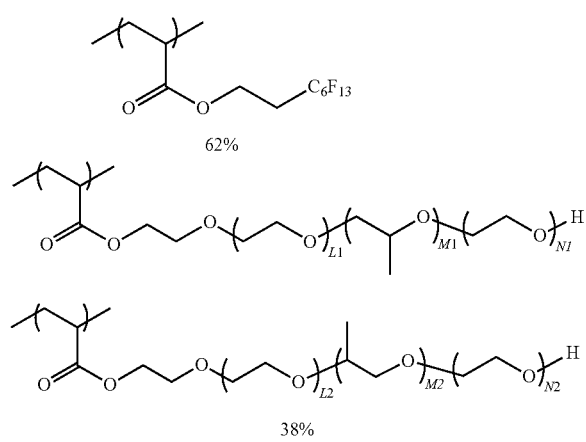

L1 + N1 + L2 + N2 = 14
M1 + M2 = 17

<Evaluation of Curability>

The coloring composition was slit-applied onto a glass substrate. Next, the applied coloring composition was heated on a hot plate at 90° C. for 120 seconds to remove the solvent, thereby forming a coating film having a film thickness of 20 μm. Subsequently, the coating film was exposed using ultrahigh-pressure mercury at 300 mJ/cm² (measured with i-rays), and then heated in an oven at 230° C. for 60 minutes to produce a cured film (flat film).

For the obtained cured film, a pencil hardness was measured according to JIS K5600-5-4: 1999. A harder film is more preferable.

A: 3H or more
B: 2H or more and less than 3H
C: 1H or more and less than 2H
D: Less than 1H <Evaluation of Color Unevenness>

The coloring composition was stored for 1 to 6 months in an environment of a temperature of 23° C. and a humidity of 50%.

Using the coloring composition after storage, pattern formation was carried out by a method shown in Production Example 1 or Production Example 2 below, thereby producing a color filter.

Production Example 1

Pattern Formation Using Dry Etching Method

The coloring composition after the storage (Examples 1 to 10, 12, 17, and 18, and Comparative Examples 1 to 3) was applied onto a glass substrate in 7.5 cm×7.5 cm using a spin coater such that the film thickness became 0.5 μm. The resultant was heated on a hot plate at 200° C. for 5 minutes and the coating film was cured to prepare a colored layer. The film thickness of the colored layer was 0.5 μm.

Subsequently, a positive tone photoresist "FHi622BC" (manufactured by Fujifilm Electronics Materials Co., Ltd.) was applied thereonto, and subjected to a pre-baking treatment at 90° C. for 1 minute to form a photoresist layer having a film thickness of 0.8 μm.

Subsequently, the photoresist layer was patternwise exposed at an expose dose of 350 mJ/cm², using an i-ray stepper (manufactured by Canon Inc.), and subjected to a heating treatment at the temperature of the photoresist layer or an atmospheric temperature reaching 90° C. for 1 minute. A developing treatment was carried out with a developer "FHD-5" (manufactured by Fujifilm Electronics Materials Co., Ltd.) for 1 minute, and then subjected to a post-baking treatment at 110° C. for 1 minute to form a resist pattern. The resist pattern was formed with one side of 1.0 μm in size, taking consideration an etching conversion difference (reduction in the pattern width by etching).

Next, the obtained glass substrate was attached to a 200 mm (8 inch) silicon wafer, and subjected to a first-stage etching treatment for 80 seconds at a radio frequency (RF) power of 800 W, an antenna bias of 400 W, a wafer bias of 200 W, an internal pressure of a chamber of 4.0 Pa, a substrate temperature of 50° C., and gas types and flow rates of a mixed gas: $CF_4$: 80 mL/minute, $O_2$: 40 mL/minute, and Ar: 800 mL/minute in a dry etching device (U-621, manufactured by Hitachi High-Technologies Corporation).

Subsequently, in the same etching chamber, the glass substrate was subjected to a second-stage etching treatment and an over-etching treatment for 28 seconds at a radio frequency (RF) power of 600 W, an antenna bias of 100 W, a wafer bias of 250 W, an internal pressure of a chamber of 2.0 Pa, a substrate temperature of 50° C., and gas types and flow rates of a mixed gas: $N_2$: 500 mL/minute, $O_2$: 50 mL/minute, and Ar: 500 mL/minute ($N_2/O_2/Ar$=10/1/10), with an over-etching rate in the same etching chamber.

After carrying out the dry etching under the conditions, a peeling treatment was carried out using a photoresist peeling solution "MS230C" (manufactured by Fujifilm Electronic Materials Co., Ltd.) at 50° C. for 120 seconds to remove the resist, thereby forming a colored pattern. Furthermore, washing with pure water and spin drying were carried out, and then a dehydration baking treatment was carried out at 100° C. for 2 minutes, thereby obtaining a color filter.

Production Example 2

Pattern Formation Using Photolithographic Method

CT-4000L (manufactured by Fujifilm Electronics Materials Co., Ltd.) was uniformly applied onto a 200 mm (8 inch) silicon wafer by spin coating to form a coating film. The coating film thus formed was treated in an oven at 220° C. for 1 hour and the coating film was cured to form an undercoat layer, thereby producing a silicon wafer with an undercoat layer. Further, the coating rotation speed of the spin coating was adjusted such that the film thickness of the coating film after the heating treatment became about 0.1 μm.

Next, the coloring composition after the storage (Example 11) was applied onto the undercoat layer of the silicon wafer with the undercoat layer to form a colored layer (coating film). Further, a heating treatment (pre-baking) was carried out using a hot plate at 100° C. for 120 seconds such that the dry film thickness of the coating film became 1 μm.

Subsequently, the coating film was exposed at a wavelength of 365 nm with various exposure doses in the range of 50 to 1,200 mJ/cm$^2$, through a patterned mask having a 1.0-μm$^2$ island pattern, using an i-ray stepper exposure apparatus FPA-3000i5+(manufactured by Canon, Inc.).

Thereafter, the silicon wafer substrate on which a coating film had been formed after the irradiation was placed on a horizontal rotary table of a spin-shower processor (DW-30 type, manufactured by Chemitronics Co., Ltd.), and subjected to a puddle development at 23° C. for 60 seconds using a CD-2000 (manufactured by Fuji Film Electronics Materials Co., Ltd.) as a developer to form a colored pattern.

The silicon wafer on which a colored pattern had been formed was fixed to the horizontal rotary table by a vacuum chuck method. While the silicon wafer was rotated by a rotating apparatus at a rotation speed of 50 rpm, a rinsing treatment was carried out by supplying purified water provided in a shower from above the rotational center of the silicon wafer from discharge nozzles, and then spin-drying was carried out. Then, post-baking was carried out in a hot plate at 200° C. for 300 seconds to form a colored pattern having a film thickness of 1 μm, thereby forming a color filter.

Production Example 3

A color filter was obtained by the same method as in Production Example 2 except that the coloring composition of Example 13 was used as a coloring composition, and a developer including 0.3% by mass of tetramethylammonium hydroxide and 0.3% by mass of PIONIN D-6112 (manufactured by Takemoto Oil & Fat Co., Ltd.) was used instead of CD-2000 (manufactured by Fuji Film Electronics Materials Co., Ltd.) with water as a balance as a developer.

Production Example 4

A color filter was obtained by the same method as in Production Example 2 except that the coloring composition of Example 14 was used as a coloring composition, and a developer including 0.19% by mass of tetramethylammonium hydroxide, 0.2% by mass of OLFINE E1010 (manufactured by Takemoto Oil & Fat Co., Ltd.), and 0.2% by mass of diglycol amine was used instead of CD-2000 (manufactured by Fuji Film Electronics Materials Co., Ltd.) with water as a balance as a developer.

Production Example 5

A color filter was obtained by the same method as in Production Example 2 except that the coloring composition of Example 15 was used as a coloring composition, and a developer including 0.14% by mass of tetramethylammonium hydroxide, 0.15% by mass of OLFINE E1010 (manufactured by Takemoto Oil & Fat Co., Ltd.), and 0.15% by mass of diethanolamine was used instead of CD-2000 (manufactured by Fuji Film Electronics Materials Co., Ltd.) with water as a balance as a developer.

Production Example 6

A color filter was obtained by the same method as in Production Example 2 except that the coloring composition of Example 16 was used as a coloring composition, and a developer including 0.29% by mass of tetramethylammonium hydroxide, 0.30% by mass of OLFINE E1010 (manufactured by Takemoto Oil & Fat Co., Ltd.), and 0.30% by mass of diethanolamine was used instead of CD-2000 (manufactured by Fuji Film Electronics Materials Co., Ltd.) with water as a balance as a developer.

(Evaluation of Color Unevenness)

The obtained color filter (colored pattern) was disposed between the observation lens and the light source of an optical microscope, light was irradiated toward the observation lens, and the state of the transmitted light was observed with an optical microscope equipped with a digital camera of a magnification of 1,000. The digital camera installed on the optical microscope was equipped with a charge-coupled device (CCD) having 1.28 million pixels, and the digital camera captured images of the film surface of the color filter through which light was transmitted. The images taken were stored as digitally converted data (digital images) in an 8-bit bitmap format.

In addition, the images of the film surface of the color filter were taken at 20 arbitrarily selected regions. The digitally converted data was stored after digitalizing the brightness of the colors of B of the taken images into a density distribution of a scale of 256 tones from 0 to 255.

Subsequently, the stored digital image was compartmentalized in a lattice form so that the size of one lattice was corresponding to 2 μm$^2$ on the actual substrate, and the brightness within one compartment was averaged. In the present Example, since images were taken at an optical magnification of 1,000 with a digital camera with 1.28 million pixels, 2 μm on the actual substrate corresponded to 2 mm on the image taken and the image sized on the display was 452 mm×352 mm, and therefore, the total number of compartments in a single region was 39,776.

For all of the compartments, the average brightness of one arbitrary compartment and the average brightness of all the compartments adjacent thereto were measured. In a case where the difference in the average brightness between the adjacent compartments was 5 or more, such a compartment was considered as a compartment with a significant difference. The average total number of the compartments with a significant difference in the entire region, and the proportion occupied by the average total number of compartments with a significant difference in the entire region with respect to the total number of compartments (39,776) in each region (hereinafter also simply referred to as a "proportion") were calculated. A smaller numerical value thereof is evaluated to correspond to small color unevenness. A case where the number of compartments with a significant difference is 800 or less and the proportion is 3% or less is evaluated as a level without a problem in practical use.

Evaluation Standard

A: The number of compartments with a significant difference is less than 500 and the proportion is less than 2%.

B: The number of compartments with a significant difference is 800 or less and the proportion is 3% or less (provided that a case corresponding to A is excluded).

C: The number of compartments with a significant difference is more than 800 and/or the proportion is more than 3%.

TABLE 4

| | Curability (pencil hardness) | Color unevenness Storage period | | | |
|---|---|---|---|---|---|
| | | 1 month | 2 months | 3 months | 6 months |
| Example 1 | A | A | A | A | B |
| Example 2 | A | A | A | A | A |
| Example 3 | B | A | A | A | B |
| Example 4 | A | A | A | A | B |
| Example 5 | A | A | A | A | B |
| Example 6 | A | A | A | B | B |
| Example 7 | A | A | A | B | B |
| Example 8 | A | A | A | A | B |
| Example 9 | A | A | A | A | A |
| Example 10 | C | A | A | A | B |
| Example 11 | B | A | A | A | B |
| Example 12 | C | A | A | A | B |
| Example 13 | B | A | A | A | B |
| Example 14 | B | A | A | A | B |
| Example 15 | B | A | A | A | B |
| Example 16 | B | A | A | A | B |
| Example 17 | A | A | A | A | A |
| Example 18 | A | A | A | A | B |
| Comparative Example 1 | A | A | B | C | C |
| Comparative Example 2 | A | A | B | C | C |
| Comparative Example 3 | D | A | A | B | C |

From the results, in Examples, a cured film having suppressed color unevenness even in a case where the coloring composition is used after being stored for a long period of time could be produced. On the other hand, in Comparative Examples, as the storage period was longer, the color unevenness could occur more easily.

What is claimed is:

1. A coloring composition comprising:
a halogenated zinc phthalocyanine pigment;
a maleimide compound represented by Formula (1);
a curable compound other than the maleimide compound; and
a solvent,
wherein the molecular weight of the maleimide compound is 100 to 400, and the content of the maleimide compound is 0.08 to 0.8 parts by mass with respect to 100 parts by mass of the halogenated zinc phthalocyanine pigment,

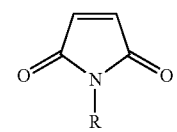

in Formula (1), R represents an alkyl group or an aryl group.

2. The coloring composition according to claim 1, wherein the maleimide compound is contained in the amount of 0.05% to 0.5% by mass with respect to the total solid content of the coloring composition.

3. The coloring composition according to claim 1, wherein the maleimide compound is contained in the amount of 0.2 to 2.0 parts by mass with respect to 100 parts by mass of the curable compound.

4. The coloring composition according to claim 1, wherein the curable compound includes a compound having an epoxy group.

5. The coloring composition according to claim 4, further comprising an aromatic amine compound.

6. The coloring composition according to claim 1, wherein the curable compound includes a compound having an ethylenically unsaturated bond.

7. The coloring composition according to claim 1, wherein the curable compound includes a compound having an epoxy group and a compound having an ethylenically unsaturated bond.

8. The coloring composition according to claim 1, further comprising a coloring agent having an azo group.

9. The coloring composition according to claim 1, used for a color filter.

10. A color filter using the coloring composition according to claim 1.

11. A solid-state imaging device comprising the color filter according to claim 10.

12. An image display device comprising the color filter according to claim 10.

13. A pattern forming method comprising:
forming a coloring composition layer on a support, using the coloring composition according to claim 1; and
forming a pattern on the coloring composition layer by a photolithographic method or a dry etching method.

* * * * *